(12) United States Patent
Nishioka et al.

(10) Patent No.: US 10,438,749 B2
(45) Date of Patent: Oct. 8, 2019

(54) ELECTRONIC COMPONENT AND SUBSTRATE INCLUDING ELECTRONIC COMPONENT

(71) Applicant: Murata Manufacturing Co., Ltd., Nagaokakyo-shi, Kyoto-fu (JP)

(72) Inventors: Yoshinao Nishioka, Nagaokakyo (JP); Yasuo Fujii, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 15/876,247

(22) Filed: Jan. 22, 2018

(65) Prior Publication Data

US 2018/0211785 A1    Jul. 26, 2018

(30) Foreign Application Priority Data

Jan. 26, 2017   (JP) .................. 2017-012026

(51) Int. Cl.
*H01G 4/012* (2006.01)
*H01G 4/252* (2006.01)
(Continued)

(52) U.S. Cl.
CPC ............. *H01G 4/252* (2013.01); *H01G 4/008* (2013.01); *H01G 4/012* (2013.01); *H01G 4/12* (2013.01); *H01G 4/1245* (2013.01); *H01G 4/224* (2013.01); *H01G 4/232* (2013.01); *H01G 4/248* (2013.01); *H01G 4/30* (2013.01); *H01G 4/1227* (2013.01); *H01G 4/1236* (2013.01); *H05K 3/3442* (2013.01); *H05K 2201/10015* (2013.01); *H05K 2201/10636* (2013.01)

(58) Field of Classification Search
CPC .......... H01G 4/06; H01G 4/005; H01G 4/012; H01G 4/12; H01G 4/08; H01G 4/30; H01G 4/228; H01G 4/232
See application file for complete search history.

(56) References Cited

U.S. PATENT DOCUMENTS

2006/0256495 A1\* 11/2006 Tominaga ............ H01G 4/2325
                                                    361/118
2010/0238605 A1\* 9/2010 Lee ........................ H01G 2/065
                                                    361/306.3
(Continued)

FOREIGN PATENT DOCUMENTS

JP       2012-080079 A    4/2012

*Primary Examiner* — Nguyen T Ha
(74) *Attorney, Agent, or Firm* — Keating & Bennett, LLP

(57) ABSTRACT

An electronic component includes a multilayer body including dielectric layers and inner electrodes alternately laminated together, first to third outer electrodes arranged in this order in one direction on a first main surface of the multilayer body, and fourth to sixth outer electrodes provided on a second main surface opposite to the first main surface such that at least a portion of the fourth outer electrode, at least a portion of the fifth outer electrode, and at least a portion of the sixth outer electrode respectively face the first outer electrode, the second outer electrode, and the third outer electrode. The first, third, and fifth outer electrodes are electrically connected to one another. The second, fourth, and sixth outer electrodes are electrically connected to one another and each have a polarity different from that of the first outer electrode.

18 Claims, 21 Drawing Sheets

(51) Int. Cl.
*H01G 4/30* (2006.01)
*H01G 4/008* (2006.01)
*H01G 4/12* (2006.01)
*H01G 4/248* (2006.01)
*H01G 4/224* (2006.01)
*H01G 4/232* (2006.01)
H05K 3/34 (2006.01)

(56) References Cited

U.S. PATENT DOCUMENTS

| | | | |
|---|---|---|---|
| 2012/0057268 A1 | 3/2012 | Tsutsumi | |
| 2012/0154978 A1* | 6/2012 | Kim | H01G 4/1209 |
| | | | 361/321.2 |
| 2015/0014040 A1* | 1/2015 | Ahn | H01G 4/30 |
| | | | 174/260 |
| 2015/0109718 A1* | 4/2015 | Choi | H01G 2/06 |
| | | | 361/304 |
| 2015/0115893 A1* | 4/2015 | Lee | H01G 4/30 |
| | | | 320/135 |
| 2015/0325378 A1* | 11/2015 | Park | H03H 7/0115 |
| | | | 333/185 |
| 2016/0268044 A1* | 9/2016 | Gu | H01G 4/12 |

* cited by examiner

ELECTRONIC COMPONENT AND SUBSTRATE INCLUDING ELECTRONIC COMPONENT

CROSS REFERENCE TO RELATED APPLICATIONS

This application claims the benefit of priority to Japanese Patent Application No. 2017-012026 filed on Jan. 26, 2017. The entire contents of this application are hereby incorporated herein by reference.

BACKGROUND OF THE INVENTION

1. Field of the Invention

The present invention relates to an electronic component and a substrate that includes an electronic component.

2. Description of the Related Art

A known electronic component includes a multilayer body including a plurality of dielectric layers and a plurality of inner electrodes alternately laminated together and an outer electrode provided on a surface of the multilayer body.

As an example of such an electronic component, Japanese Unexamined Patent Application Publication No. 2012-80079 describes an electronic component 210 that has a configuration illustrated in FIG. 21. The electronic component 210 includes a multilayer body 211, a first outer electrode 220, and a second outer electrode 230, the first and second outer electrodes 220 and 230 being provided on a surface of the multilayer body 211.

The first outer electrode 220 includes a first side-surface electrode 221 that is provided on a first side surface S3, a first main-surface electrode 222 that is connected to the first side-surface electrode 221 and provided on a first main surface S1, which is located on the outer side of the multilayer body 211 in a lamination direction of the multilayer body 211, and a second main-surface electrode 223 that is provided on a second main surface S2.

The second outer electrode 230 includes a second side-surface electrode 231 that is provided on a second side surface S4, a third main-surface electrode 232 that is connected to the second side-surface electrode 231 and provided on the first main surface S1, and a fourth main-surface electrode 233 that is provided on the second main surface S2.

The first main-surface electrode 222 is provided so as to be in contact with a first corner C1 of the first main surface S1, and the second main-surface electrode 223 is provided so as to be in contact with a second corner C2 of the second main surface S2. The third main-surface electrode 232 is provided so as to be in contact with a third corner C3 that is diagonally opposite to the first corner C1 of the first main surface S1, and the fourth main-surface electrode 233 is provided so as to be in contact with a fourth corner C4 that is diagonally opposite to the second corner C2 of the second main surface S2.

The electronic component 210 described in Japanese Unexamined Patent Application Publication No. 2012-80079 has a configuration in which a signal is transmitted in a short-side direction of the first main surface S1, and thus, a signal path is shorter and wider than that in a configuration in which a signal is transmitted in a long-side direction, so that equivalent series inductance (ESL) is able to be reduced.

However, there has been a demand for a further reduction in ESL in electronic components, and it is assumed that there is room for improvement in order to reduce ESL.

SUMMARY OF THE INVENTION

Preferred embodiments of the present invention provide electronic components capable of achieving a reduction in ESL and substrates that includes such electronic components.

According to a preferred embodiment of the present invention, an electronic component includes a multilayer body that includes a plurality of dielectric layers and a plurality of inner electrodes alternately laminated together, a first outer electrode, a second outer electrode, and a third outer electrode that are arranged in this order in one direction on a first main surface of the multilayer body, the first main surface being located on an outer side of the multilayer body in a lamination direction, a fourth outer electrode that is provided on a second main surface opposite to the first main surface such that at least a portion of the fourth outer electrode faces the first outer electrode, a fifth outer electrode that is provided on the second main surface such that at least a portion of the fifth outer electrode faces the second outer electrode, and a sixth outer electrode that is provided on the second main surface such that at least a portion of the sixth outer electrode faces the third outer electrode. The first outer electrode, the third outer electrode, and the fifth outer electrode are electrically connected to one another. The second outer electrode, the fourth outer electrode, and the sixth outer electrode are electrically connected to one another and each have a polarity that is different from a polarity of each of the first outer electrode, the third outer electrode, and the fifth outer electrode.

The first outer electrode, the third outer electrode, and the fifth outer electrode may be electrically connected to one another on surfaces of the multilayer body via a first side-surface electrode that is provided on a first side surface of the multilayer body, and the second outer electrode, the fourth outer electrode, and the sixth outer electrode may be electrically connected to one another on the surfaces of the multilayer body via a second side-surface electrode that is provided on a second side surface opposite to the first side surface.

In addition, the electronic component may further include a first via conductor that connects the first outer electrode and first inner electrodes included in the plurality of inner electrodes, the first inner electrodes having the same polarity, a second via conductor that connects the second outer electrode and second inner electrodes included in the plurality of inner electrodes, the second inner electrodes having a polarity different from the polarity of the first inner electrodes, a third via conductor that connects the third outer electrode and the first inner electrodes, a fourth via conductor that connects the fourth outer electrode and the second inner electrodes, a fifth via conductor that connects the fifth outer electrode and the first inner electrodes, and a sixth via conductor that connects the sixth outer electrode and the second inner electrodes. The first outer electrode, the third outer electrode, and the fifth outer electrode may be connected to one another via the first via conductor, the third via conductor, the fifth via conductor, and the first inner electrodes, and the second outer electrode, the fourth outer electrode, and the sixth outer electrode may be electrically connected to one another via the second via conductor, the fourth via conductor, the sixth via conductor, and the second inner electrodes.

Four or more outer electrodes including the first outer electrode, the second outer electrode, and the third outer electrode may be provided on the first main surface such that the outer electrodes having different polarities are alternately arranged, and four or more outer electrodes including the fourth outer electrode, the fifth outer electrode, and the sixth outer electrode may be provided on the second main surface such that the outer electrodes having different polarities are alternately arranged. The number of the outer electrodes provided on the second main surface is equal to the number of the outer electrodes provided on the first main surface, and the four or more outer electrodes provided on the second main surface are arranged such that at least a portion of each of the outer electrodes faces a corresponding one of the four or more outer electrodes provided on the first main surface.

The number of the outer electrodes provided on the first main surface and the number of the outer electrodes provided on the second main surface may each be an odd number.

The one direction may be parallel or substantially parallel to a long-side direction of each of the first main surface and the second main surface.

According to another preferred embodiment of the present invention, a substrate includes the electronic component described above.

The electronic component may be built into the substrate.

In the substrate, each of the outer electrodes, which are provided on the first main surface and the second main surface, may be connected to a substrate conductor that extends in a direction perpendicular or substantially perpendicular to the first main surface and the second main surface and through which a current flows when the substrate conductor is energized.

In an electronic component according to a preferred embodiment of the present invention, three or more outer electrodes are provided on each of the first main surface and the second main surface of the multilayer body such that the outer electrodes having different polarities are alternately arranged. At least a portion of each of the three or more outer electrodes provided on the second main surface and at least a portion of a corresponding one of the three or more outer electrodes provided on the first main surface face each other, and the polarities of the outer electrodes provided on the second main surface are different from those of the corresponding outer electrodes provided on the first main surface. Therefore, the distance between outer electrodes having different polarities is small, so that a reduction in ESL is achieved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described below with reference to the drawings to specifically describe features of the present invention.

First Preferred Embodiment

Figure 1:
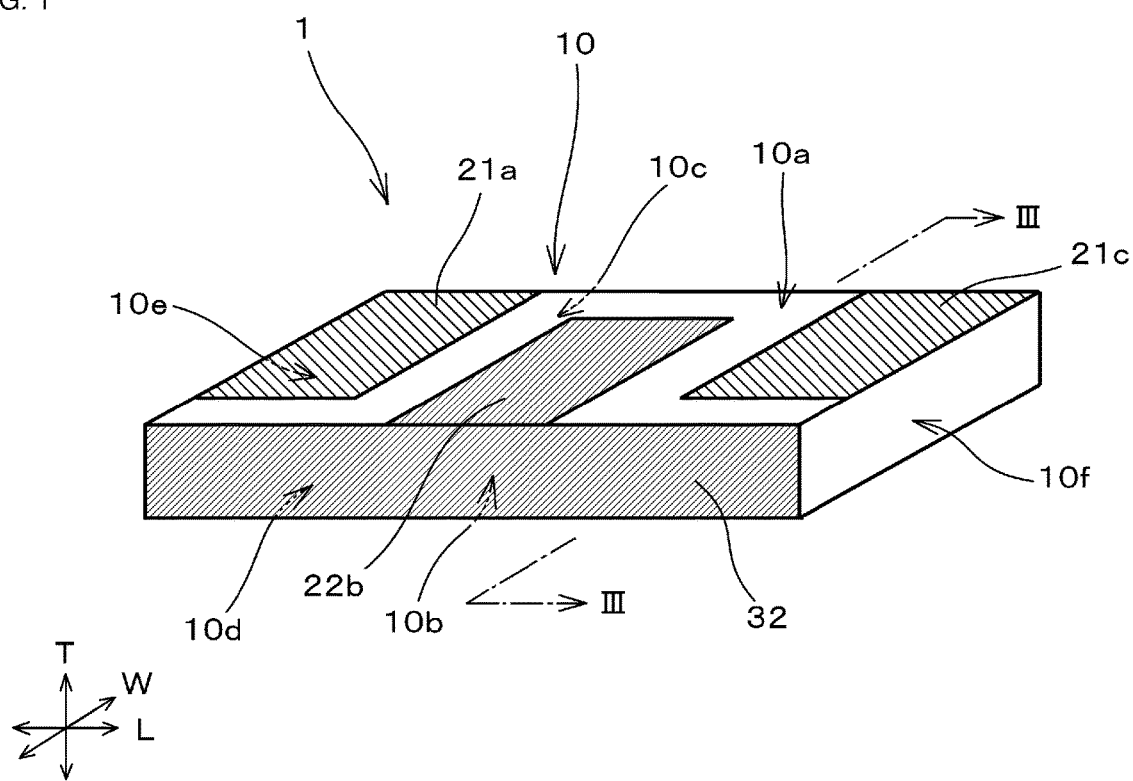
FIG. 1 is an external perspective view of an electronic component according to a first preferred embodiment of the present invention when viewed from a first main surface side.
Figure 2:
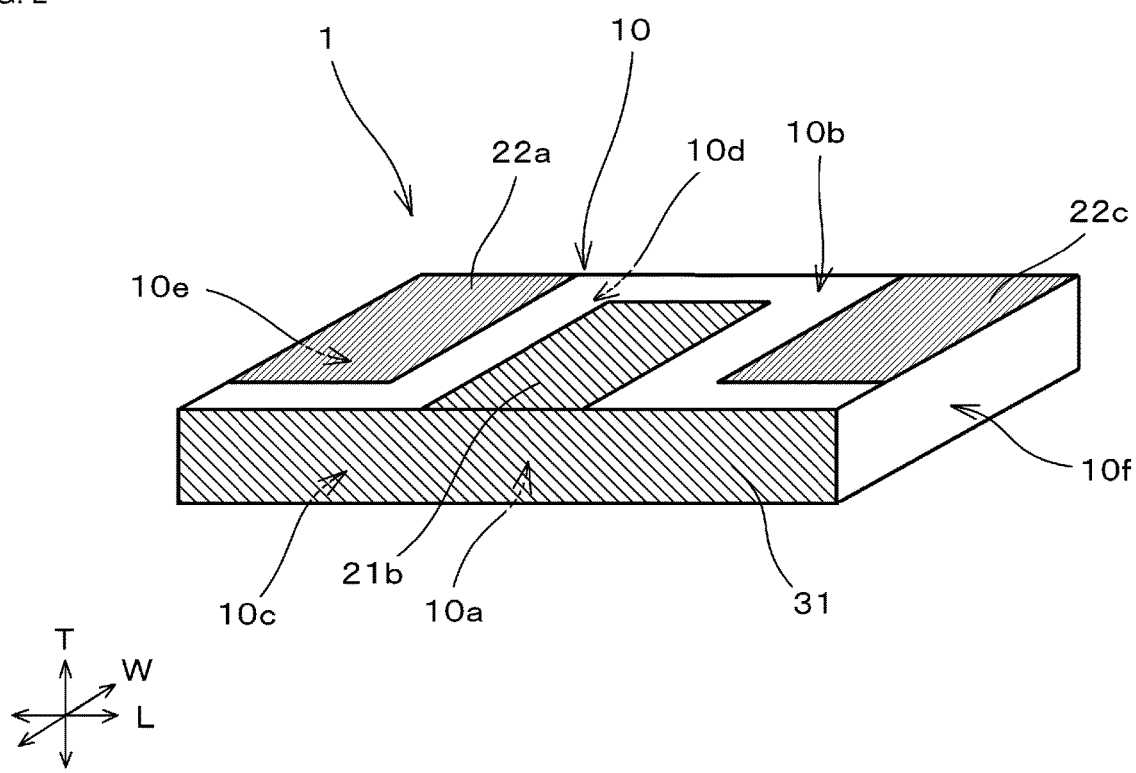
FIG. 2 is an external perspective view of the electronic component according to the first preferred embodiment of the present invention when viewed from a second main surface side.
Figure 3:
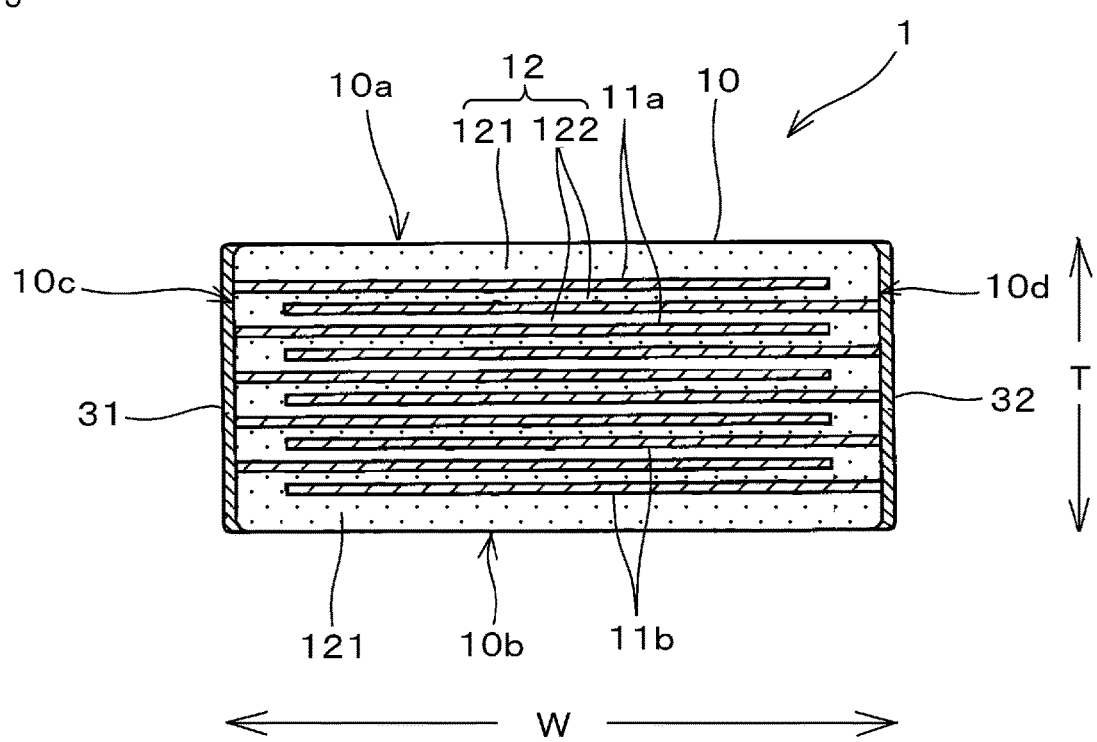
FIG. 3 is a cross-sectional view of the electronic component illustrated in FIG. 1 taken along line III-III.

FIG. 1 is an external perspective view of an electronic component 1 according to a first preferred embodiment of the present invention when viewed from a first main surface 10a. FIG. 2 is an external perspective view of the electronic component 1 according to the first preferred embodiment when viewed from a second main surface 10b. FIG. 3 is a cross-sectional view of the electronic component 1 illustrated in FIG. 1 taken along line III-III.

The electronic component 1 is preferably, for example, a multilayer ceramic capacitor. However, the electronic component 1 is not limited to a multilayer ceramic capacitor and may be, for example, a thermistor or a piezoelectric component. A case in which the electronic component 1 is a multilayer ceramic capacitor will be described below.

As illustrated in FIG. 1 and FIG. 2, the electronic component 1 includes a multilayer body 10 and outer electrodes 21a, 21b, 21c, 22a, 22b, and 22c each of which is provided on a surface of the multilayer body 10. As will be described later, the multilayer body 10 includes a plurality of dielectric ceramic layers 122 and a plurality of inner electrodes 11 (11a and 11b) that are alternately laminated together.

The electronic component 1 preferably has a rectangular or substantially rectangular parallelepiped shape when seen as a whole, for example. Here, the longitudinal direction of the electronic component 1 is defined as a lengthwise direction L. A direction in which the inner electrodes 11 are laminated is defined as a thickness direction T. A direction perpendicular or substantially perpendicular to both of the lengthwise direction L and the thickness direction T is defined as a width direction W.

The multilayer body 10 has a rectangular or substantially rectangular parallelepiped shape when seen as a whole and includes a first end surface 10e, a second end surface 10f, the first main surface 10a, the second main surface 10b, a first side surface 10c, and a second side surface 10d. The first end surface 10e and the second end surface 10f face each other in the lengthwise direction L. The first main surface 10a and the second main surface 10b face each other in the thickness direction T. The first side surface 10c and the second side surface 10d face each other in the width direction W.

Note that, in the present specification, the term "substantially rectangular parallelepiped shape" includes a substantially rectangular parallelepiped shape with rounded corner portions and rounded ridge portions. A portion defined by three surfaces of the multilayer body 10 intersecting one another is a corner portion, and a portion defined by two surfaces of the multilayer body 10 intersecting each other is a ridge portion. Irregularities and the like may be present on portions of or the entire surfaces of the multilayer body 10, the surfaces including the first and second main surfaces 10a and 10b, the first and second side surfaces 10c and 10d, and the first and second end surfaces 10e and 10f.

As illustrated in FIG. 3, the multilayer body 10 includes a ceramic layer 12, the first inner electrodes 11a, and the second inner electrodes 11b.

The ceramic layer 12 includes outer-layer ceramic layers 121, each of which is an outer portion of the multilayer body 10 in the thickness direction of the multilayer body 10, and the dielectric ceramic layers 122, each of which is a dielectric layer located between one of the first inner electrodes 11a and a corresponding one of the second inner electrodes 11b.

For example, the ceramic layer 12 is preferably made of a material that includes, as a main component, barium titanate ($BaTiO_3$), calcium titanate ($CaTiO_3$), strontium titanate ($SrTiO_3$), barium calcium titanate (($Ba_{1-x}Ca_x$)$_zTiO_3$), calcium zirconate ($CaZrO_3$), or other suitable materials. A subcomponent, such as a Mg compound, a Mn compound, a Si compound, an Al compound, a V compound, or a Ni compound, may be added to the above-mentioned main component such that the content of the subcomponent is lower than that of the main component.

The first inner electrodes 11a and the second inner electrodes 11b are alternately arranged in the thickness direction T with the dielectric ceramic layers 122 interposed therebetween. The first inner electrodes 11a are extended to the first side surface 10c of the multilayer body 10. The second inner electrodes 11b are extended to the second side surface 10d.

Figure 4:
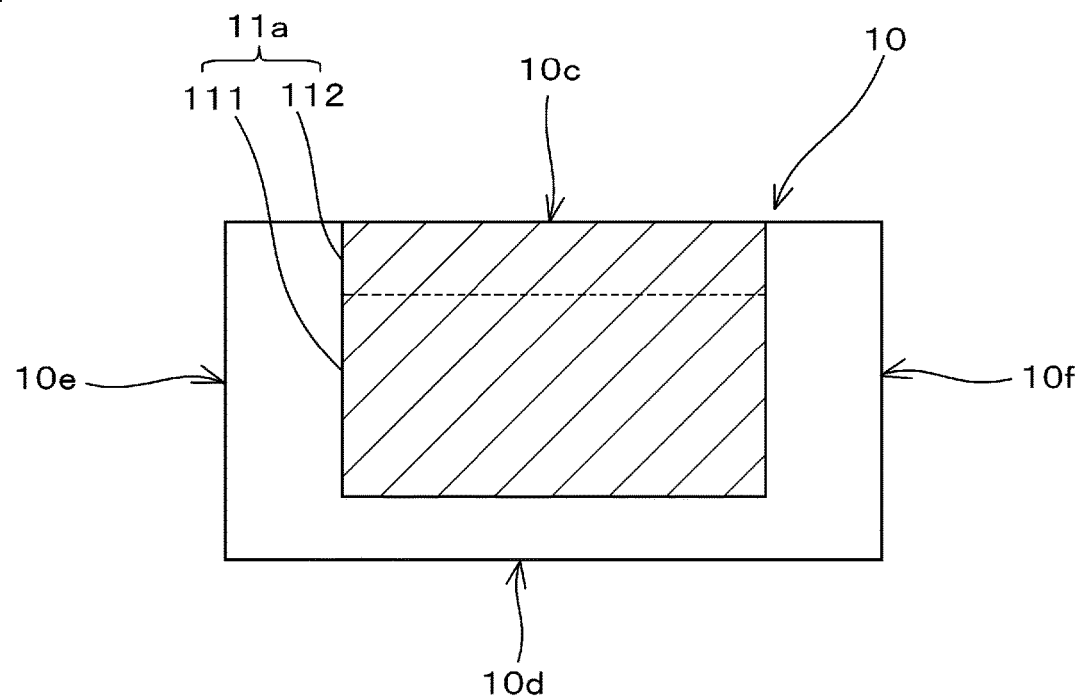
FIG. 4 is a plan view of one of first inner electrodes disposed in a multilayer body.

FIG. 4 is a plan view of one of the first inner electrodes 11a disposed in the multilayer body 10. As illustrated in FIG. 4, the first inner electrode 11a includes a first facing electrode portion 111, which is a portion facing the corresponding second inner electrode 11b, and a first extended electrode portion 112, which is a portion that is extended from the first facing electrode portion 111 to the first side surface 10c of the multilayer body 10.

Figure 5:
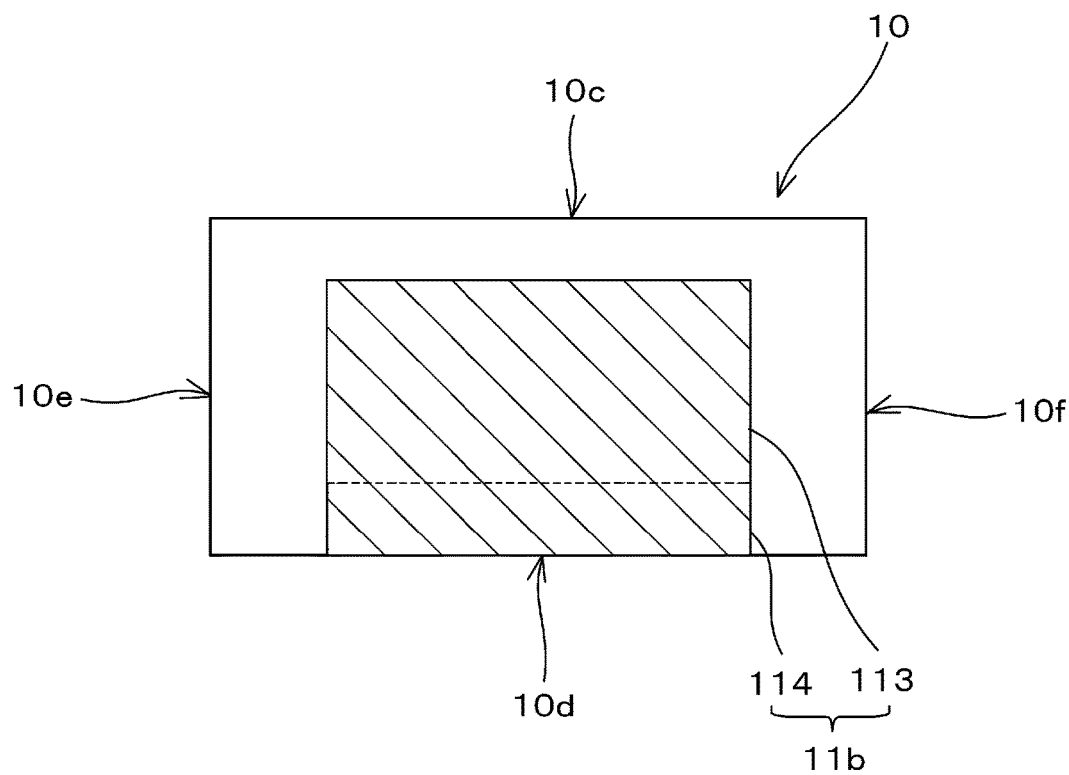
FIG. 5 is a plan view of one of second inner electrodes disposed in the multilayer body.

FIG. 5 is a plan view of one of the second inner electrodes 11b disposed in the multilayer body 10. As illustrated in FIG. 5, the second inner electrode 11b includes a second facing electrode portion 113, which is a portion facing the corresponding first inner electrode 11a, and a second extended electrode portion 114, which is a portion that is extended from the second facing electrode portion 113 to the second side surface 10d of the multilayer body 10.

An electrostatic capacitance is generated as a result of the first facing electrode portions 111 of the first inner electrodes 11a and the second facing electrode portions 113 of the second inner electrodes 11b facing each other with the dielectric ceramic layers 122 interposed therebetween, so that the electronic component 1 defines and functions as a capacitor.

The first inner electrodes 11a and the second inner electrodes 11b are preferably made of, for example, a metal such as Cu, Ni, Ag, Pd, or Au, or an alloy containing at least one type of these metals (e.g., an alloy of Ag and Pd). The first inner electrodes 11a and the second inner electrodes 11b may further include dielectric particles having the same composition system as a ceramic included in the ceramic layer 12.

As illustrated in FIG. 1, the first outer electrode 21a, the second outer electrode 22b, and the third outer electrode 21c are arranged on the first main surface 10a of the multilayer body 10 in this order in the lengthwise direction L.

The first outer electrode 21a preferably has a rectangular or substantially rectangular shape and is connected to a first side-surface electrode 31 that is provided on the first side surface 10c. The first outer electrode 21a and the second side surface 10d are spaced apart from each other, and the first outer electrode 21a is not connected to a second side-surface electrode 32 that is provided on the second side surface 10d.

The second outer electrode 22b preferably has a rectangular or substantially rectangular shape and is connected to the second side-surface electrode 32 provided on the second side surface 10d. The second outer electrode 22b and the first side surface 10c are spaced apart from each other, and the second outer electrode 22b is not connected to the first side-surface electrode 31 provided on the first side surface 10c.

The third outer electrode 21c preferably has a rectangular or substantially rectangular shape and is connected to the first side-surface electrode 31 provided on the first side surface 10c. The third outer electrode 21c and the second side surface 10d are spaced apart from each other, and the third outer electrode 21c is not connected to the second side-surface electrode 32 provided on the second side surface 10d.

As illustrated in FIG. 2, the fourth outer electrode 22a, the fifth outer electrode 21b, and the sixth outer electrode 22c are arranged on the second main surface 10b of the multilayer body 10 in this order in the lengthwise direction L.

The fourth outer electrode 22a preferably has a rectangular or substantially rectangular shape and is provided such that at least a portion thereof faces the first outer electrode 21a. The fourth outer electrode 22a is connected to the second side-surface electrode 32 provided on the second side surface 10d. In the first preferred embodiment, at least half or more of the fourth outer electrode 22a faces the first outer electrode 21a. The fourth outer electrode 22a and the first side surface 10c are spaced apart from each other, and the fourth outer electrode 22a is not connected to the first side-surface electrode 31 provided on the first side surface 10c.

The fifth outer electrode 21b preferably has a rectangular or substantially rectangular shape and is provided such that at least a portion thereof faces the second outer electrode 22b. The fifth outer electrode 21b is connected to the first side-surface electrode 31 provided on the first side surface 10c. In the first preferred embodiment, at least half or more of the fifth outer electrode 21b faces the second outer electrode 22b. The fifth outer electrode 21b and the second side surface 10d are spaced apart from each other, and the fifth outer electrode 21b is not connected to the second side-surface electrode 32 provided on the second side surface 10d.

The sixth outer electrode 22c preferably has a rectangular or substantially rectangular shape and is provided such that at least a portion thereof faces the third outer electrode 21c. The sixth outer electrode 22c is connected to the second side-surface electrode 32 provided on the second side surface 10d. In the first preferred embodiment, at least half or more of the sixth outer electrode 22c faces the third outer electrode 21c. The sixth outer electrode 22c and the first side surface 10c are spaced apart from each other, and the sixth outer electrode 22c is not connected to the first side-surface electrode 31 provided on the first side surface 10c.

The first outer electrode 21a, the third outer electrode 21c, and the fifth outer electrode 21b are electrically connected to one another on the surfaces of the multilayer body 10 via the first side-surface electrode 31 and have the same polarity. The first outer electrode 21a, the third outer electrode 21c, and the fifth outer electrode 21b are electrically connected to the first inner electrodes 11a via the first side-surface electrode 31.

The second outer electrode 22b, the fourth outer electrode 22a, and the sixth outer electrode 22c are electrically connected to one another on the surfaces of the multilayer body 10 via the second side-surface electrode 32 and have a polarity different from that of the first outer electrode 21a, the third outer electrode 21c, and the fifth outer electrode 21b. The second outer electrode 22b, the fourth outer electrode 22a, and the sixth outer electrode 22c are electrically connected to the second inner electrodes 11b via the second side-surface electrode 32.

The outer electrodes 21a, 21b, 21c, 22a, 22b, and 22c may be baked electrodes that are formed by, for example, applying a conductive paste including metal powder, such as Ni powder, Cu powder, or Ag powder, and glass to the surfaces of the multilayer body 10 and then firing the conductive paste. A plating layer such as a Cu plating layer may be provided on each of the baked electrodes.

Note that the outer electrodes 21a, 21b, 21c, 22a, 22b, and 22c are not limited to the above-described baked electrodes and may be, for example, sputtered electrodes that are formed by a sputtering method. A sputtered electrode is preferable because it is more advantageous than a baked electrode in terms of being formed in a thin layer and dimensional accuracy. As a material used for a sputtered electrode, for example, alloys such as NiCr and NiCu or metals such as Ti and Cu may preferably be used.

As described above, the second outer electrode 22b, which is provided on the first main surface 10a, has a polarity different from that of the first and third outer electrodes 21a and 21c, which are adjacent to the second outer electrode 22b. In other words, the outer electrodes having different polarities are alternately arranged in the longitudinal direction on the first main surface 10a.

In addition, the fifth outer electrode 21b, which are provided on the second main surface 10b, has a polarity different from that of the fourth and sixth outer electrodes 22a and 22c, which are adjacent to the fifth outer electrode 21b. In other words, the outer electrodes having different polarities are alternately arranged in the longitudinal direction on the second main surface 10b.

As described above, in the electronic component 1 according to the first preferred embodiment, three of the outer electrodes are arranged on each of the first main surface 10a and the second main surface 10b of the multilayer body 10 such that the outer electrodes having different polarities are alternately arranged. At least a portion of each of the three outer electrodes 21a, 22b, and 21c provided on the second main surface 10b and at least a portion of a corresponding one of the three outer electrodes 22a, 21b, and 22c provided on the first main surface 10a face each other, and the polarities of the outer electrodes 21a, 22b, and 21c are different from those of the corresponding outer electrodes 22a, 21b, and 22c. As a result, the distance between outer electrodes having different polarities is shorter than that in, for example, a configuration in which two outer electrodes are provided on a main surface as in the above-described electronic component of Japanese Unexamined Patent Application Publication No. 2012-80079, so that a reduction in equivalent series inductance (ESL) is achieved.

Figure 6:
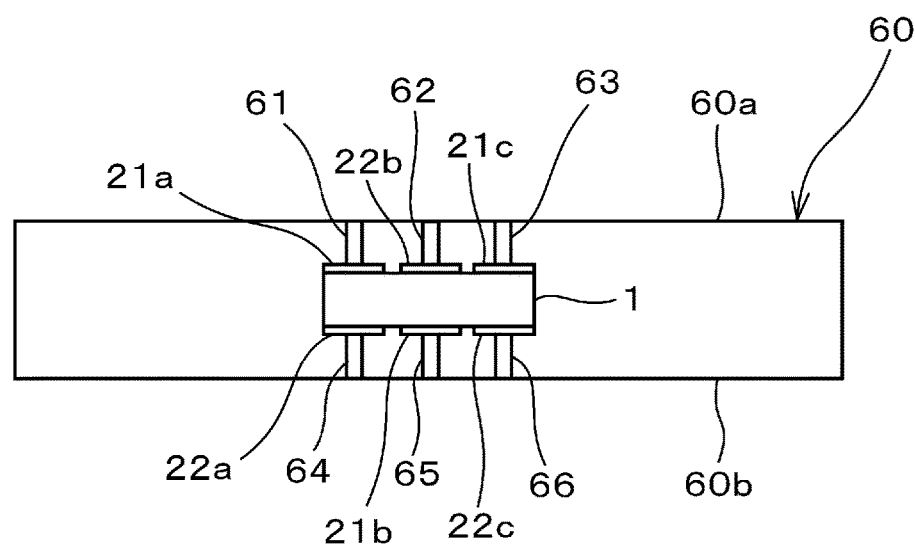
FIG. 6 is a cross-sectional view of a substrate that includes the electronic component according to the first preferred embodiment of the present invention built therein.

For example, the electronic component 1 according to the first preferred embodiment is preferably used by being built into a substrate. FIG. 6 is a cross-sectional view of a substrate 60 that includes the electronic component 1 according to the first preferred embodiment built therein.

As illustrated in FIG. 6, the first outer electrode 21a, the second outer electrode 22b, and the third outer electrode 21c are respectively connected to a first substrate conductor 61, a second substrate conductor 62, and a third substrate conductor 63. Each of the first substrate conductor 61, the second substrate conductor 62, and the third substrate conductor 63 is extended in a direction perpendicular or substantially perpendicular to the first main surface 10a of the multilayer body 10 and connected to, for example, a wiring line (not illustrated) positioned at a first main surface 60a of the substrate 60.

As illustrated in FIG. 6, the fourth outer electrode 22a, the fifth outer electrode 21b, and the sixth outer electrode 22c are respectively connected to a fourth substrate conductor 64, a fifth substrate conductor 65, and a sixth substrate conductor 66. Each of the fourth substrate conductor 64, the fifth substrate conductor 65, and the sixth substrate conductor 66 is extended in a direction perpendicular or substantially perpendicular to the second main surface 10b of the multilayer body 10 and connected to, for example, a wiring line (not illustrated) positioned at a second main surface 60b of the substrate 60.

A current flows in the same direction through the first substrate conductor 61 and the third substrate conductor 63, which are respectively connected to the first outer electrode 21a and the third outer electrode 21c having the same polarity. A current flows through the second substrate conductor 62, which is connected to the second outer electrode 22b having the polarity different from that of the first and third outer electrodes 21a and 21c, in a direction opposite to the direction in which the current flows through the first substrate conductor 61 and the third substrate conductor 63.

A current flows in the same direction through the fourth substrate conductor 64 and the sixth substrate conductor 66, which are respectively connected to the fourth outer electrode 22a and the sixth outer electrode 22c having the same polarity. A current flows through the fifth substrate conductor 65, which is connected to the fifth outer electrode 21b having the polarity different from that of the fourth and sixth outer electrodes 22a and 22c, in a direction opposite to the direction in which the current flows through the fourth substrate conductor 64 and the sixth substrate conductor 66.

In other words, currents in opposite directions flow through each adjacent ones of the substrate conductors, which are the first substrate conductor 61 and the second substrate conductor 62, the second substrate conductor 62 and the third substrate conductor 63, the fourth substrate conductor 64 and the fifth substrate conductor 65, and the fifth substrate conductor 65 and the sixth substrate conductor 66.

Figure 7:
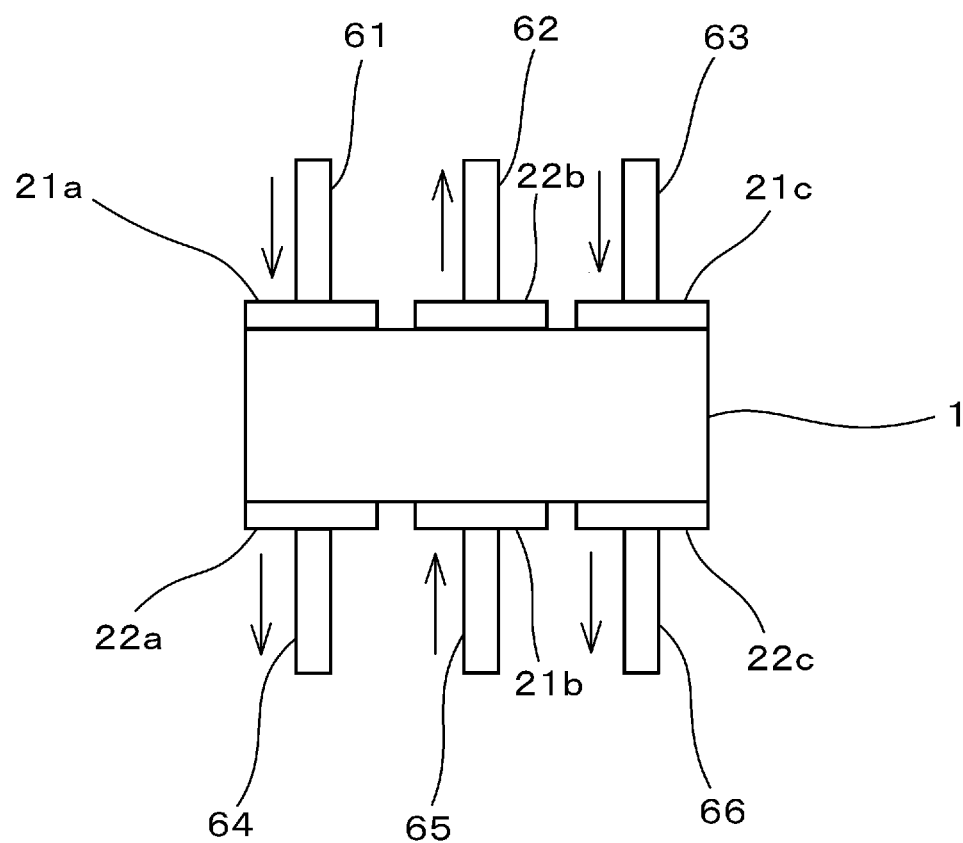
FIG. 7 is a diagram illustrating directions in which a current flows through substrate conductors in the case where the current flows into a first outer electrode, a third outer electrode, and a fifth outer electrode and flows out from a second outer electrode, a fourth outer electrode, and a sixth outer electrode.

As an example, in FIG. 7, directions in which the current flows through the substrate conductors 61 to 66 in the case where the current flows into the first outer electrode 21a, the third outer electrode 21c, and the fifth outer electrode 21b and flows out from the second outer electrode 22b, the fourth outer electrode 22a, and the sixth outer electrode 22c are indicated by arrows. In the case where the current flows out from the first outer electrode 21a, the third outer electrode 21c, and the fifth outer electrode 21b and flows into the second outer electrode 22b, the fourth outer electrode 22a, and the sixth outer electrode 22c, the directions in which the current flows through the substrate conductors 61 to 66 are opposite to the directions indicated by the arrows in FIG. 7.

When the current flows through the substrate conductors, a self-induced magnetic flux is generated, and also a mutually-induced magnetic flux is generated by the adjacent substrate conductors. As described above, since currents in opposite directions flow through each adjacent ones of the substrate conductors, the self-induced magnetic flux and the mutually-induced magnetic flux act so as to cancel each other out, and the inductance is reduced.

As illustrated in FIG. 7, the current flows in the same direction through two of the substrate conductors (e.g., the first substrate conductor 61 and the fourth substrate conductor 64), which are connected to the corresponding two outer electrodes facing each other in the thickness direction T. As a result, magnetic fields that are generated as a result of the current flowing through the two substrate conductors, which are connected to the corresponding two outer electrodes facing each other in the thickness direction T, are oriented in the same direction, so that the current may easily flow through these two substrate conductors, and a reduction in ESL is achieved.

Figure 21:
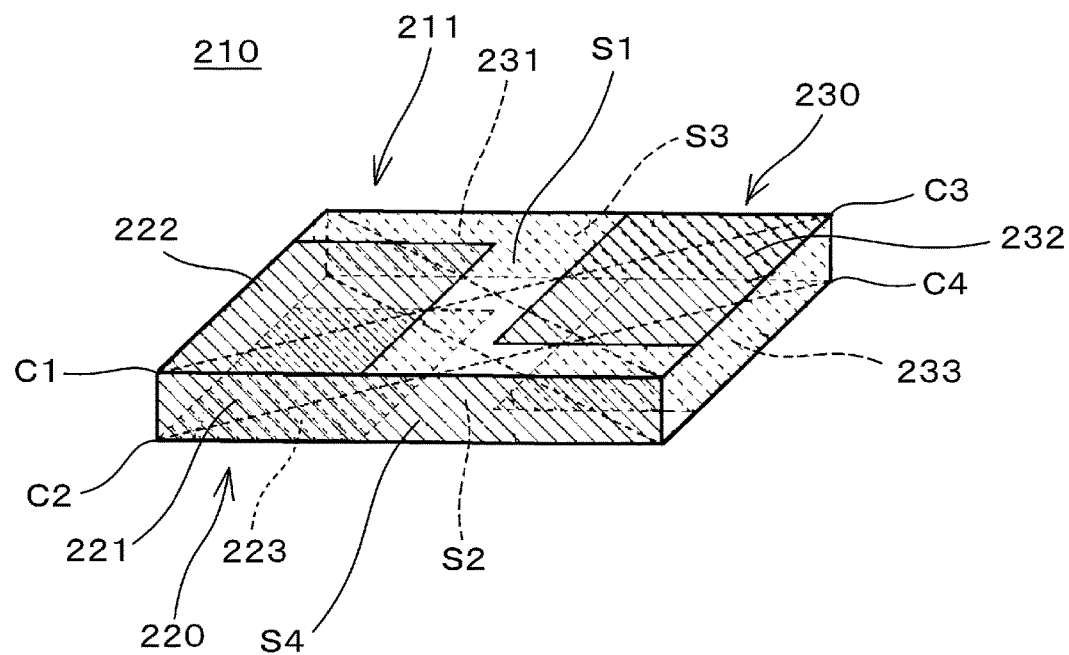
FIG. 21 is an external perspective view of an electronic component of the related art described in Japanese Unexamined Patent Application Publication No. 2012-80079.

An example of a multilayer ceramic capacitor that is the electronic component 1 according to the first preferred embodiment having the above-described configuration and a multilayer ceramic capacitor according to a comparative example having the configuration illustrated in FIG. 21 were manufactured, and the ESL of each of the multilayer ceramic capacitors was measured. The specifications of each of the multilayer ceramic capacitors are set as follows.

Inner electrodes were made of Ni. The dimension of each of the inner electrodes in the longitudinal direction was about 0.9 mm. The dimension of each of the inner electrodes in the lateral direction, which is perpendicular to the longitudinal direction, was about 0.5 mm. The average thickness of each of the inner electrodes was about 0.5 µm. Fifty of the inner electrodes were laminated together.

A ceramic layer was made of barium titanate, and the average thicknesses of dielectric ceramic layers each of which was located between a corresponding two of the inner electrodes were each set to about 1 µm.

The dimension of a multilayer body in the lengthwise direction L was set to about 1.0 mm. The dimension of the multilayer body in the width direction W was set to about 0.6 mm. The dimension of the multilayer body in the thickness direction T was set to about 0.1 mm.

Outer electrodes were formed by forming sputtered electrodes by a sputtering method using NiCr and NiCu and then performing Cu plating on the sputtered electrodes. The average thickness of each of the sputtered electrodes was set to about 0.5 µm.

As illustrated in FIG. 6, the multilayer ceramic capacitor, which is the electronic component 1 according to the first preferred embodiment, was built into a substrate, and substrate conductors were connected to the outer electrodes. Then, power was supplied to the outer electrodes via the substrate conductors, and the ESL of the multilayer ceramic capacitor was measured using a network analyzer. Similarly, the multilayer ceramic capacitor according to the comparative example was built into a substrate, and substrate conductors were connected to the outer electrodes. Then, power was supplied to the outer electrodes, and the ESL of the multilayer ceramic capacitor was measured using the network analyzer.

Here, power was directly supplied to the outer electrodes such that the absolute value of the current flowing through the outer electrodes each having a first polarity and the absolute value of the current flowing through the outer electrodes each having a second polarity were equal or approximately equal to each other. In the case of the multilayer ceramic capacitor, which is the electronic component 1 according to the first preferred embodiment, the absolute value of the current flowing through the outer electrodes 21a, 21b, and 21c and the absolute value of the current flowing through the outer electrodes 22a, 22b, and 22c were adjusted so as to be equal or approximately equal to each other.

Note that it is preferable that the absolute value of the current flowing through the outer electrodes 21a, 21b, and 21c and the absolute value of the current flowing through the outer electrodes 22a, 22b, and 22c be equal to each other. In the case where these absolute values are different from each other, among the absolute values of the currents each of which flows through one of the outer electrodes and another one of the outer electrodes, the one outer electrode and the other outer electrode being arranged so as to face each other in a lamination direction, when the larger absolute value is denoted by Ia, and the smaller absolute value is denoted by Ib, it is preferable that Ia/Ib be 1.3 or smaller, for example. In addition, it is more preferable that Ia/Ib be 1.1 or smaller, for example, and further preferably, 1.05 or smaller, for example. As the absolute values of the currents flowing through the outer electrodes 21a, 21b, and 21c become closer to the corresponding absolute values of the currents flowing through the outer electrodes the 22a, 22b, and 22c, the above-mentioned cancelling effect of a self-induced magnetic flux and a mutually-induced magnetic flux increases, and an inductance reduction effect increases.

The ESL of the multilayer ceramic capacitor according to the first preferred embodiment, which was measured using the network analyzer, was about 40 pH. In contrast, the ESL of the multilayer ceramic capacitor according to the comparative example was about 94 pH. That is to say, the ESL of the multilayer ceramic capacitor according to the first preferred embodiment was significantly reduced, whereas the ESL of the multilayer ceramic capacitor according to the comparative example was not significantly reduced.

Second Preferred Embodiment

Figure 8:
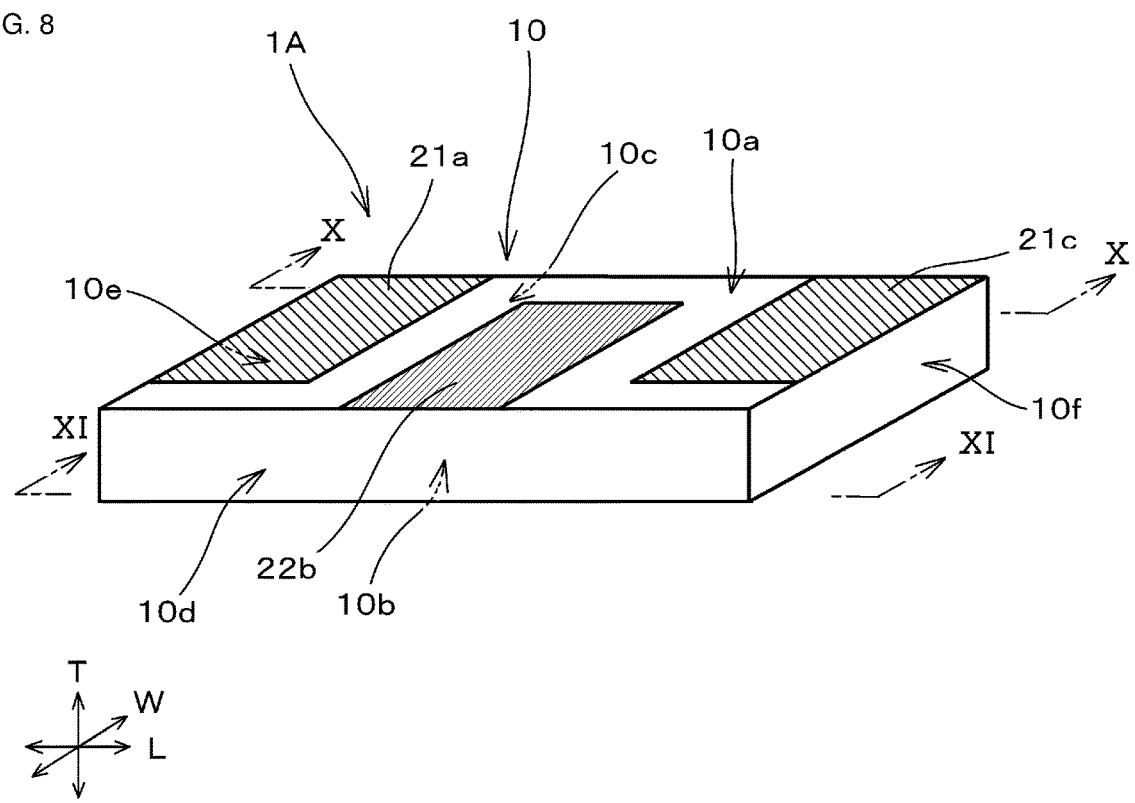
FIG. 8 is an external perspective view of an electronic component according to a second preferred embodiment of the present invention when viewed from a first main surface side.
Figure 9:
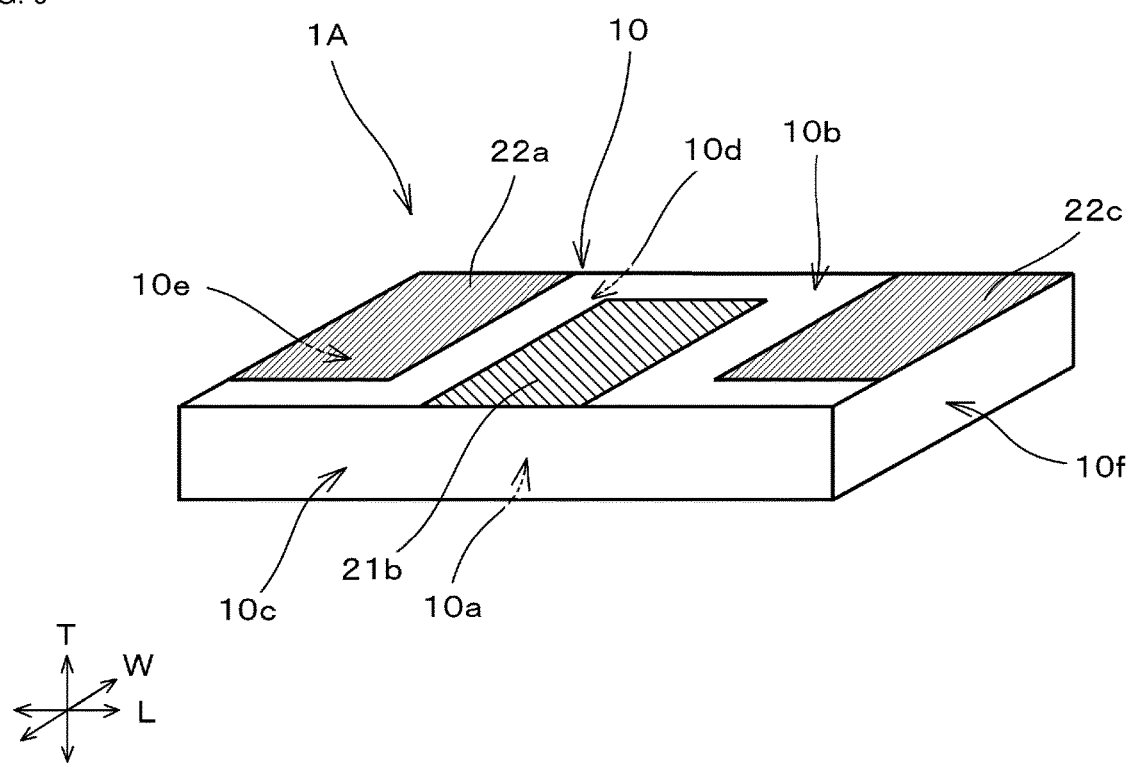
FIG. 9 is an external perspective view of the electronic component according to the second preferred embodiment of the present invention when viewed from a second main surface side.
Figure 10:
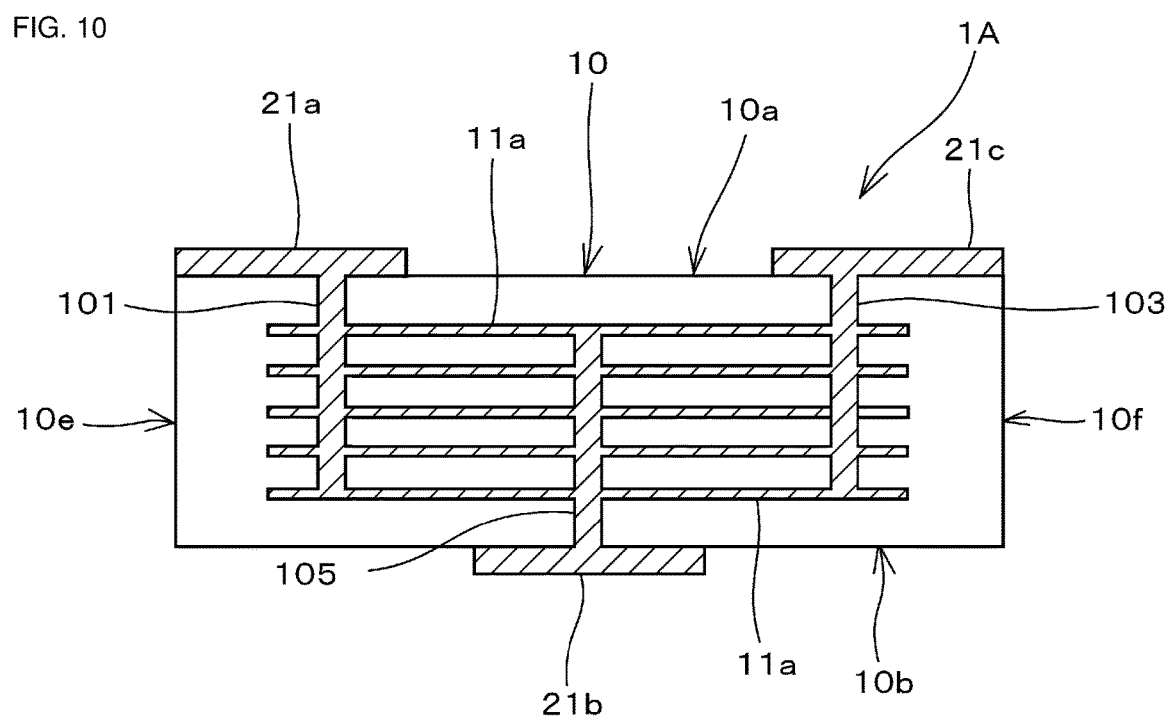
FIG. 10 is a sectional view of the electronic component illustrated in FIG. 8 taken along line X-X.

FIG. 8 is an external perspective view of an electronic component 1A according to a second preferred embodiment of the present invention when viewed from the first main surface 10a thereof, and FIG. 9 is an external perspective view of the electronic component 1A according to the second preferred embodiment when viewed from the second main surface 10b thereof. FIG. 10 is a sectional view of the electronic component 1A illustrated in FIG. 8 taken along line X-X, and FIG. 11 is a sectional view of the electronic component 1A illustrated in FIG. 8 taken along line XI-XI.

In the electronic component 1 according to the first preferred embodiment, the first outer electrode 21a, the third outer electrode 21c, and the fifth outer electrode 21b are connected to one another on the surfaces of the multilayer body 10 via the first side-surface electrode 31, and the second outer electrode 22b, the fourth outer electrode 22a, and the sixth outer electrode 22c are connected to one another on the surfaces of the multilayer body 10 via the second side-surface electrode 32.

In the electronic component 1A according to the second preferred embodiment, the first outer electrode 21a, the third outer electrode 21c, and the fifth outer electrode 21b are electrically connected to one another via the first inner electrodes 11a, and the second outer electrode 22b, the fourth outer electrode 22a, and the sixth outer electrode 22c are electrically connected to one another via the second inner electrodes 11b. Thus, as illustrated in FIG. 8 and FIG. 9, the electronic component 1A according to the second preferred embodiment does not include the first side-surface electrode 31 and the second side-surface electrode 32, which are included in the electronic component 1 according to the first preferred embodiment.

Figure 11:
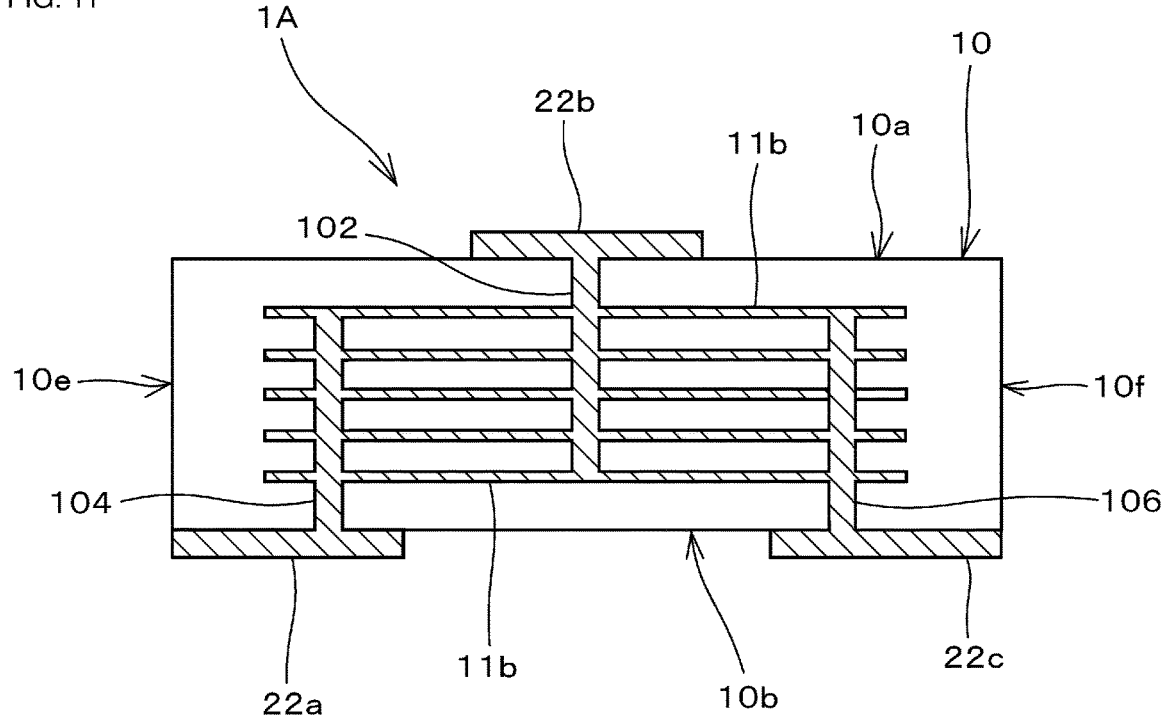
FIG. 11 is a sectional view of the electronic component illustrated in FIG. 8 taken along line XI-XI.

As illustrated in FIG. 10 and FIG. 11, a first via conductor 101, a second via conductor 102, a third via conductor 103, a fourth via conductor 104, a fifth via conductor 105, and a sixth via conductor 106 are provided in the electronic component 1A.

As illustrated in FIG. 10, the first via conductor 101 is a conductor that electrically connects the first outer electrode 21a and all the first inner electrodes 11a to one another. The third via conductor 103 is a conductor that electrically connects the third outer electrode 21c and all the first inner electrodes 11a to one another. The fifth via conductor 105 is a conductor that electrically connects the fifth outer electrode 21b and all the first inner electrodes 11a to one another.

With such a configuration, the first outer electrode 21a, the third outer electrode 21c, and the fifth outer electrode 21b are electrically connected to one another by the first via conductor 101, the third via conductor 103, the fifth via conductor 105, and the first inner electrodes 11a.

The second via conductor 102 is a conductor that electrically connects the second outer electrode 22b and all the second inner electrodes 11b to one another. The fourth via conductor 104 is a conductor that electrically connects the fourth outer electrode 22a and all the second inner electrodes 11b to one another. The sixth via conductor 106 is a conductor that electrically connects the sixth outer electrode 22c and all the second inner electrodes 11b to one another.

With such a configuration, the second outer electrode 22b, the fourth outer electrode 22a, and the sixth outer electrode 22c are electrically connected to one another by the second via conductor 102, the fourth via conductor 104, the sixth via conductor 106, and the second inner electrodes 11b.

In the electronic component 1A according to the second preferred embodiment, the positions at which the outer electrodes 21a, 21b, 21c, 22a, 22b, and 22c are provided are preferably the same or substantially the same as the positions at which the outer electrodes 21a, 21b, 21c, 22a, 22b, and 22c are provided in the electronic component 1 according to the first preferred embodiment, and the electronic component 1A according to the second preferred embodiment enables advantageous effects that are the same as or similar to those of the electronic component 1 according to the first preferred embodiment.

Third Preferred Embodiment

Figure 12:
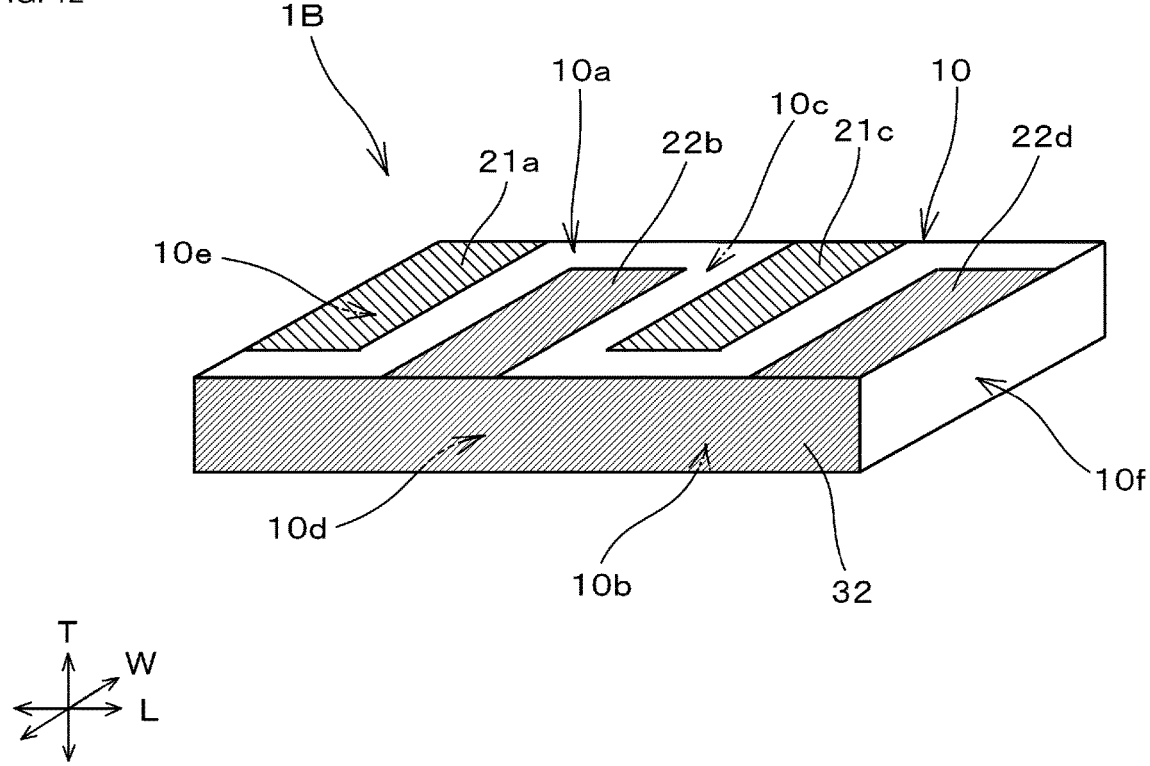
FIG. 12 is an external perspective view of an electronic component according to a third preferred embodiment of the present invention when viewed from a first main surface side.
Figure 13:
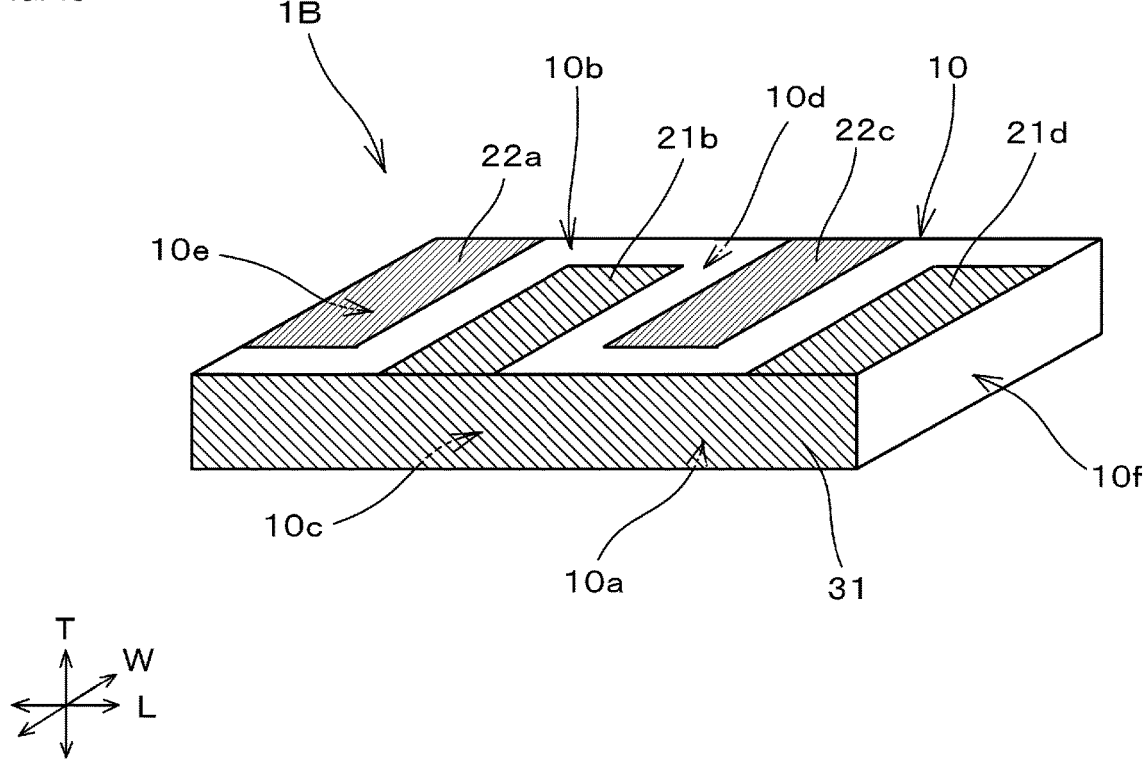
FIG. 13 is an external perspective view of the electronic component according to the third preferred embodiment of the present invention when viewed from a second main surface side.

FIG. 12 is an external perspective view of an electronic component 1B according to a third preferred embodiment of the present invention when viewed from the first main surface 10a thereof, and FIG. 13 is an external perspective view of the electronic component 1B according to the third preferred embodiment when viewed from the second main surface 10b thereof.

In each of the electronic component 1 according to the first preferred embodiment and the electronic component 1A according to the second preferred embodiment, the three outer electrodes 21a, 22b, and 21c are provided on the first main surface 10a of the multilayer body 10 such that the outer electrodes having different polarities are alternately arranged, and the three outer electrodes 22a, 21b, and 22c are provided on the second main surface 10b such that the outer electrodes having different polarities are alternately arranged.

In the electronic component 1B according to the third preferred embodiment, four outer electrodes 21a, 22b, 21c, and 22d are provided on the first main surface 10a of the multilayer body 10 such that the outer electrodes having different polarities are alternately arranged, and four outer electrodes 22a, 21b, 22c, and 21d are provided on the second main surface 10b such that the outer electrodes having different polarities are alternately arranged.

The first outer electrode 21a, the second outer electrode 22b, the third outer electrode 21c, and the seventh outer electrode 22d are provided on the first main surface 10a so as to be arranged in this order in the lengthwise direction L. Note that the configurations of the first outer electrode 21a, the second outer electrode 22b, and the third outer electrode 21c are preferably the same or substantially the same as those of the first outer electrode 21a, the second outer electrode 22b, and the third outer electrode 21c according to the first preferred embodiment, and thus, detailed descriptions thereof will be omitted.

The seventh outer electrode 22d preferably has a rectangular or substantially rectangular shape and is connected to the second side-surface electrode 32 that is provided on the second side surface 10d. The seventh outer electrode 22d and the first side surface 10c are spaced apart from each other, and the seventh outer electrode 22d is not connected to the first side-surface electrode 31 that is provided on the first side surface 10c.

The fourth outer electrode 22a, the fifth outer electrode 21b, the sixth outer electrode 22c, and the eighth outer electrode 21d are provided on the second main surface 10b so as to be arranged in this order in the lengthwise direction L. Note that the configurations of the fourth outer electrode 22a, the fifth outer electrode 21b, and the sixth outer electrode 22c are preferably the same or substantially the same as those of the fourth outer electrode 22a, the fifth outer electrode 21b, and the sixth outer electrode 22c according to the first preferred embodiment, and thus, detailed descriptions thereof will be omitted.

The eighth outer electrode 21d preferably has a rectangular or substantially rectangular shape and is provided such that at least a portion thereof faces the seventh outer electrode 22d. The eighth outer electrode 21d is connected to the first side-surface electrode 31 provided on the first side surface 10c. In the third preferred embodiment, at least half or more of the eighth outer electrode 21d faces the seventh outer electrode 22d. The eighth outer electrode 21d and the second side surface 10d are spaced apart from each other, and the eighth outer electrode 21d is not connected to the second side-surface electrode 32 provided on the second side surface 10d.

The first outer electrode 21a, the third outer electrode 21c, the fifth outer electrode 21b, and the eighth outer electrode 21d are electrically connected to one another on the surfaces of the multilayer body 10 via the first side-surface electrode 31 and have the same polarity. The first outer electrode 21a, the third outer electrode 21c, the fifth outer electrode 21b, and the eighth outer electrode 21d are electrically connected to the first inner electrodes 11a via the first side-surface electrode 31.

The second outer electrode 22b, the fourth outer electrode 22a, the sixth outer electrode 22c, and the seventh outer electrode 22d are electrically connected to one another on the surfaces of the multilayer body 10 via the second side-surface electrode 32 and each have a polarity different from that of the first outer electrode 21a. The second outer electrode 22b, the fourth outer electrode 22a, the sixth outer electrode 22c, and the seventh outer electrode 22d are electrically connected to the second inner electrodes 11b via the second side-surface electrode 32.

In the electronic component 1B according to the third preferred embodiment, four of the outer electrodes are provided on each of the first main surface 10a and the second main surface 10b, and thus, the distance between two adjacent outer electrodes having different polarities is shorter than that in the electronic component 1 according to the first preferred embodiment in which each three of the outer electrodes are provided on each of the main surfaces. As a result, the ESL is further reduced.

Figure 14:
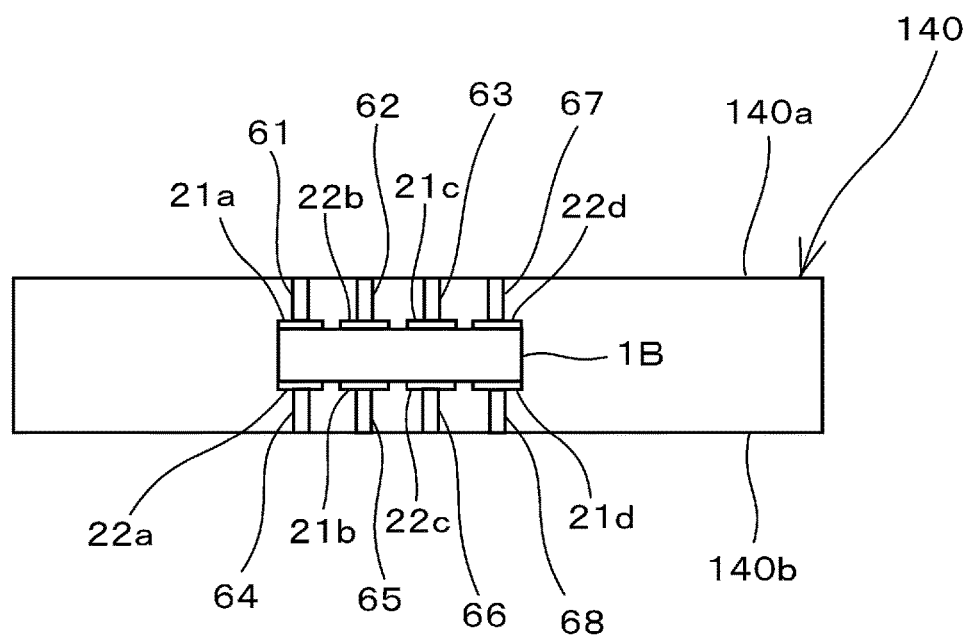
FIG. 14 is a cross-sectional view of a substrate that includes the electronic component according to the third preferred embodiment of the present invention built therein.

The electronic component 1B according to the third preferred embodiment may also be used by being built into a substrate. FIG. 14 is a cross-sectional view of a substrate 140 that includes the electronic component 1B according to the third preferred embodiment built therein.

As illustrated in FIG. 14, the first outer electrode 21a, the second outer electrode 22b, the third outer electrode 21c, and the seventh outer electrode 22d are respectively connected to the first substrate conductor 61, the second substrate conductor 62, the third substrate conductor 63, and a seventh substrate conductor 67. Here in this disclosure, a substrate conductor means a conductor included in a substrate. Each of the first substrate conductor 61, the second substrate conductor 62, the third substrate conductor 63, and the seventh substrate conductor 67 is extended in the vertical direction and connected to, for example, a wiring line (not illustrated) positioned at a first main surface 140a of the substrate 140.

In addition, as illustrated in FIG. 14, the fourth outer electrode 22a, the fifth outer electrode 21b, the sixth outer electrode 22c, and the eighth outer electrode 21d are respectively connected to the fourth substrate conductor 64, the fifth substrate conductor 65, the sixth substrate conductor 66, and an eighth substrate conductor 68. Each of the fourth substrate conductor 64, the fifth substrate conductor 65, the sixth substrate conductor 66, and the eighth substrate conductor 68 is extended in the vertical direction and connected to, for example, a wiring line (not illustrated) positioned at a second main surface 140b of the substrate 140.

Also in the third preferred embodiment, currents in opposite directions flow through adjacent ones of the substrate conductors, and thus, a self-induced magnetic flux and a mutually-induced magnetic flux act so as to cancel each other out, and the inductance is reduced.

In addition, the current flows in the same direction through two of the substrate conductors, which are connected to the corresponding two outer electrodes facing each other in the thickness direction T, and thus, magnetic fields that are generated as a result of the current flowing through the two substrate conductors, which are connected to the corresponding two outer electrodes facing each other in the thickness direction T, are oriented in the same direction. Therefore, the current may easily flow through these two substrate conductors, and the ESL is further reduced.

Fourth Preferred Embodiment

Figure 15:
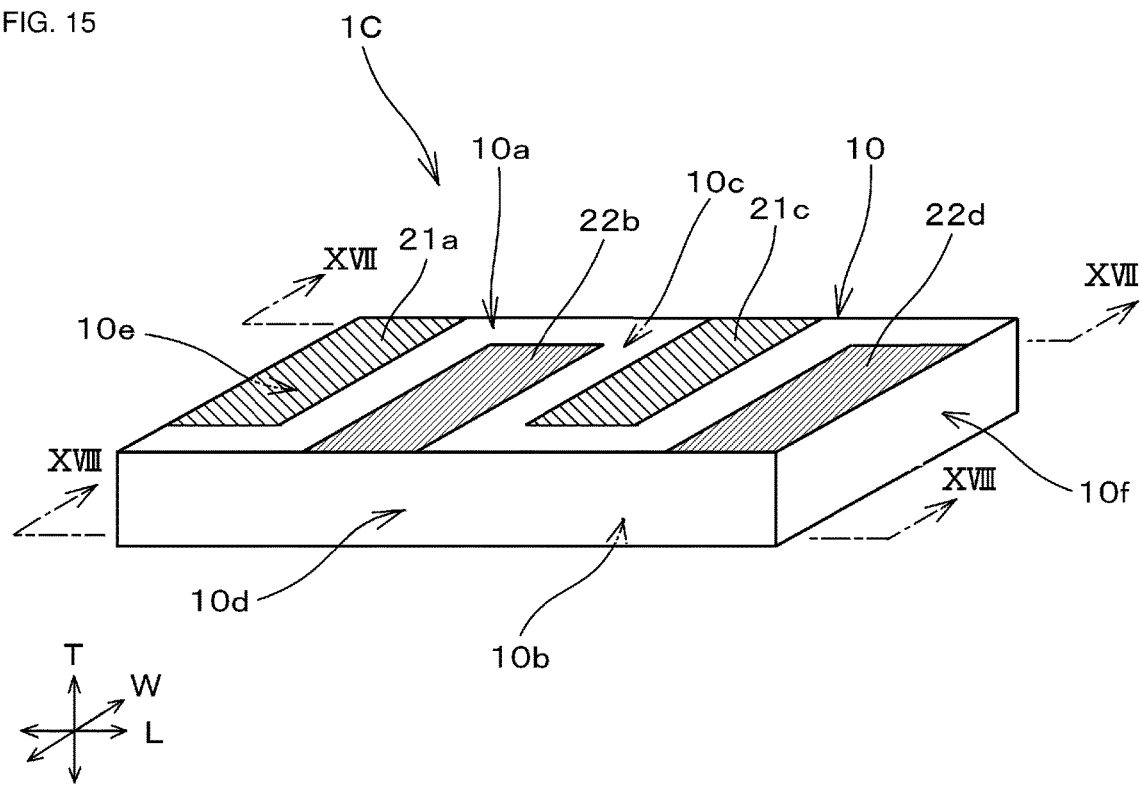
FIG. 15 is an external perspective view of an electronic component according to a fourth preferred embodiment of the present invention when viewed from a first main surface side.
Figure 16:
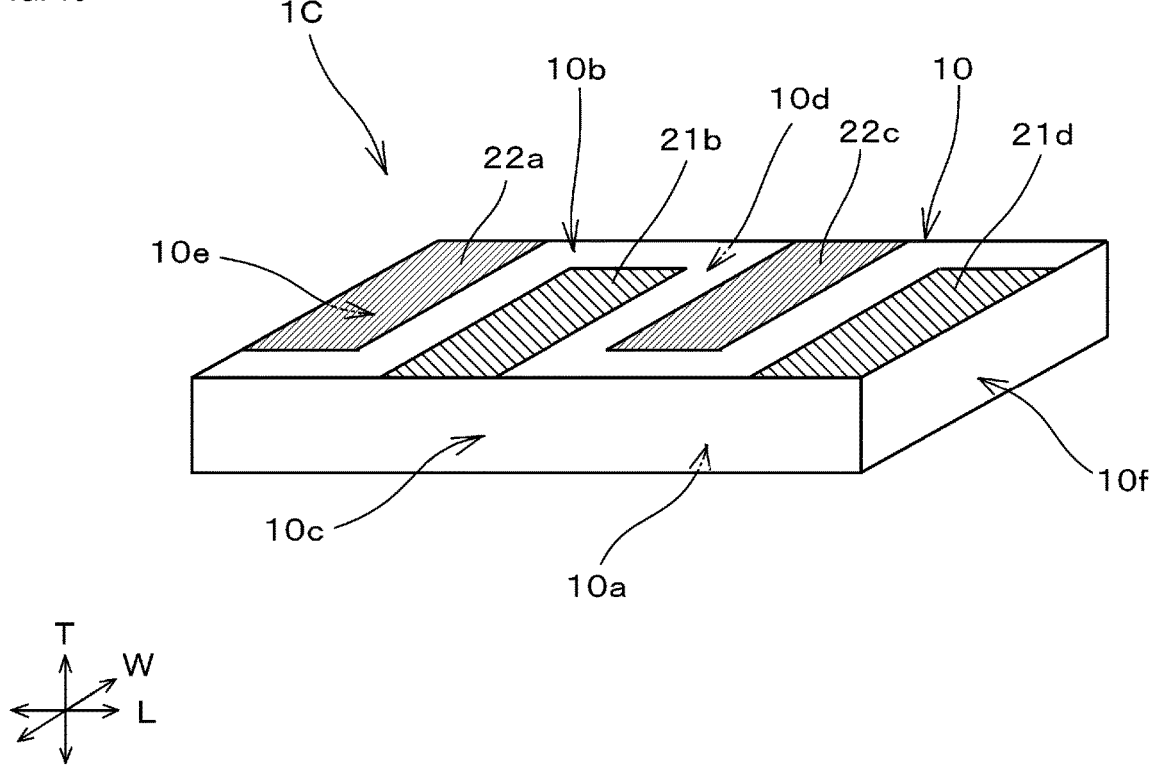
FIG. 16 is an external perspective view of the electronic component according to the fourth preferred embodiment of the present invention when viewed from a second main surface side.
Figure 17:
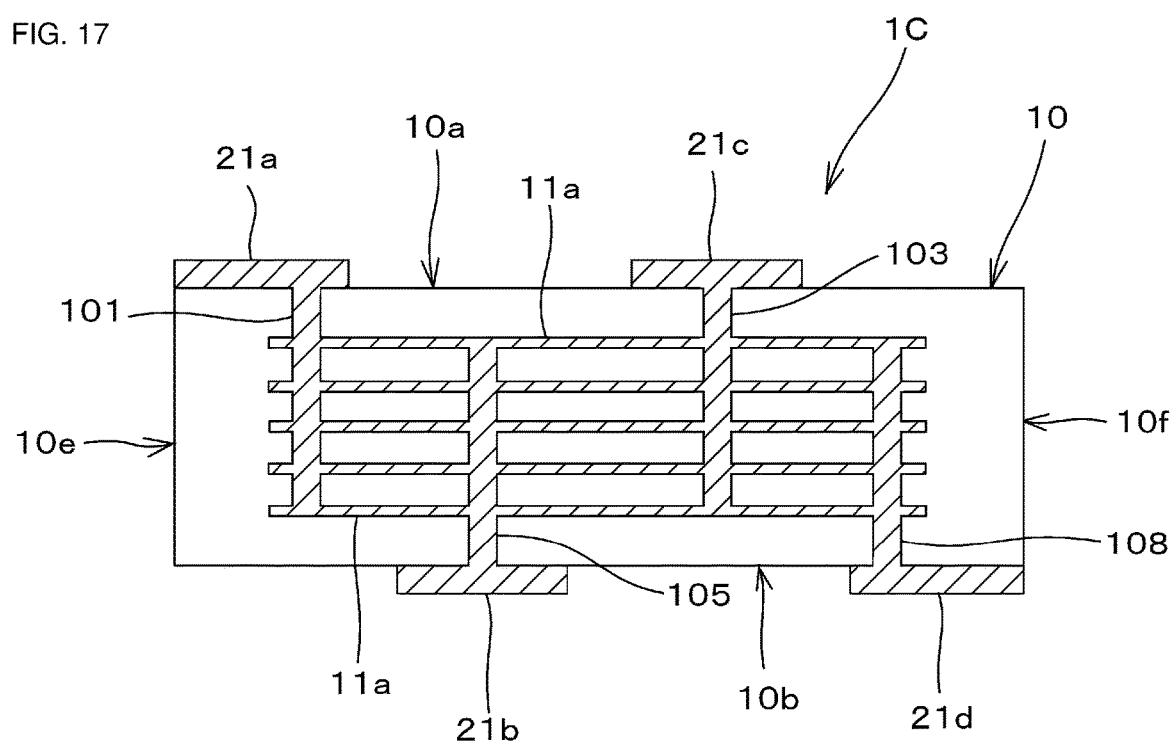
FIG. 17 is a sectional view of the electronic component illustrated in FIG. 15 taken along line XVII-XVII.

FIG. 15 is an external perspective view of an electronic component 1C according to a fourth preferred embodiment of the present invention when viewed from the first main surface 10a thereof, and FIG. 16 is an external perspective view of the electronic component 1C according to the fourth preferred embodiment when viewed from the second main surface 10b thereof. FIG. 17 is a sectional view of the electronic component 1C illustrated in FIG. 15 taken along line XVII-XVII, and FIG. 18 is a sectional view of the electronic component 1C illustrated in FIG. 15 taken along line XVIII-XVIII.

In the electronic component 1B according to the third preferred embodiment, the first outer electrode 21a, the third outer electrode 21c, the fifth outer electrode 21b, and the eighth outer electrode 21d are connected to one another on the surfaces of the multilayer body 10 via the first side-surface electrode 31, and the second outer electrode 22b, the fourth outer electrode 22a, the sixth outer electrode 22c, and the seventh outer electrode 22*d* are connected to one another on the surfaces of the multilayer body 10 via second side-surface electrode 32.

In the electronic component 1C according to the fourth preferred embodiment, the first outer electrode 21*a*, the third outer electrode 21*c*, the fifth outer electrode 21*b*, and the eighth outer electrode 21*d* are electrically connected to one another via the first inner electrodes 11*a*, and the second outer electrode 22*b*, the fourth outer electrode 22*a*, the sixth outer electrode 22*c*, and the seventh outer electrode 22*d* are electrically connected to one another via the second inner electrodes 11*b*. Thus, as illustrated in FIG. 15 and FIG. 16, the electronic component 1C according to the fourth preferred embodiment does not include the first side-surface electrode 31 and the second side-surface electrode 32, which are included in the electronic component 1B according to the third preferred embodiment.

Figure 18:
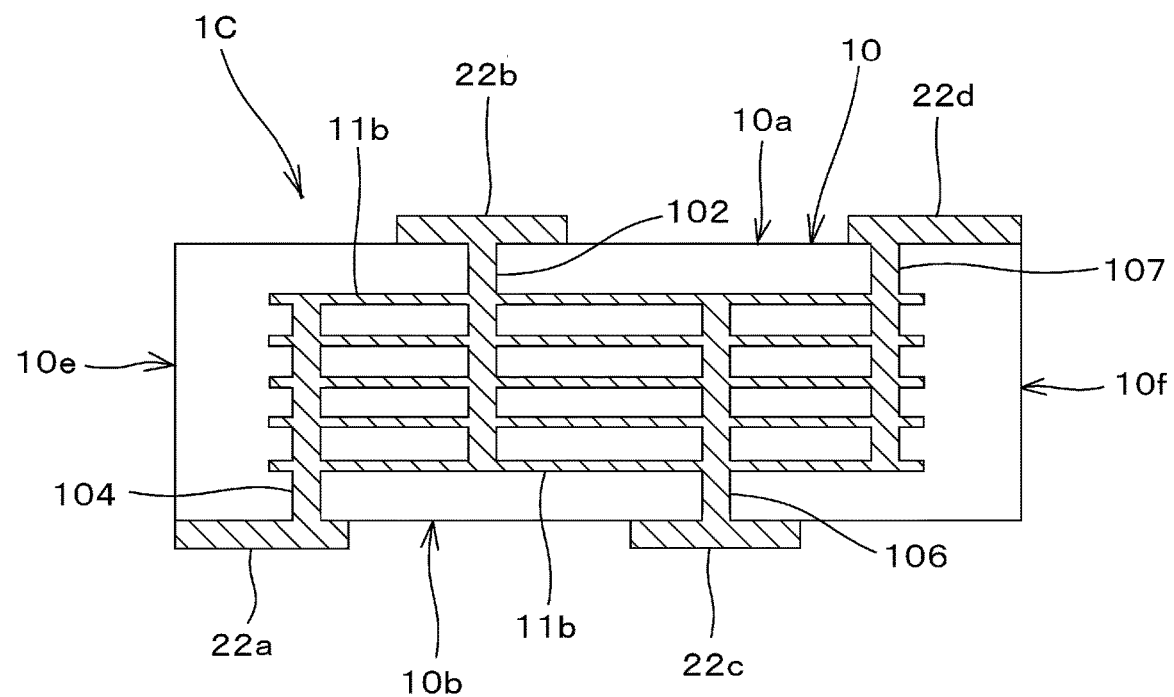
FIG. 18 is a sectional view of the electronic component illustrated in FIG. 15 taken along line XVIII-XVIII.

As illustrated in FIG. 17 and FIG. 18, the first via conductor 101, the second via conductor 102, the third via conductor 103, the fourth via conductor 104, the fifth via conductor 105, the sixth via conductor 106, a seventh inner via conductor 107, and an eighth inner via conductor 108 are provided in the electronic component 1C.

The configurations of the first via conductor 101, the second via conductor 102, the third via conductor 103, the fourth via conductor 104, the fifth via conductor 105, and the sixth via conductor 106 are the same as those of the first via conductor 101, the second via conductor 102, the third via conductor 103, the fourth via conductor 104, the fifth via conductor 105, and the sixth via conductor 106 according to the third preferred embodiment, and thus, detailed descriptions thereof will be omitted.

As illustrated in FIG. 17, the eighth inner via conductor 108 is a conductor that electrically connects the eighth outer electrode 21*d* and all the first inner electrodes 11*a* to one another.

In other words, the first outer electrode 21*a*, the third outer electrode 21*c*, the fifth outer electrode 21*b*, and the eighth outer electrode 21*d* are electrically connected to one another by the first via conductor 101, the third via conductor 103, the fifth via conductor 105, the eighth inner via conductor 108, and the first inner electrodes 11*a*.

As illustrated in FIG. 18, the seventh inner via conductor 107 is a conductor that electrically connects the seventh outer electrode 22*d* and all the second inner electrodes 11*b* to one another.

In other words, the second outer electrode 22*b*, the fourth outer electrode 22*a*, the sixth outer electrode 22*c*, and the seventh outer electrode 22*d* are electrically connected to one another by the second via conductor 102, the fourth via conductor 104, the sixth via conductor 106, the seventh inner via conductor 107, and the second inner electrodes 11*b*.

In the electronic component 1C according to the fourth preferred embodiment, the positions at which the outer electrodes 21*a*, 21*b*, 21*c*, 21*d*, 22*a*, 22*b*, 22*c*, and 22*d* are provided are preferably the same or substantially the same as the positions at which the outer electrodes 21*a*, 21*b*, 21*c*, 21*d*, 22*a*, 22*b*, 22*c*, and 22*d* are provided in the electronic component 1B according to the third preferred embodiment, and the electronic component 1C according to the fourth preferred embodiment enables advantageous effects that are the same as or similar to those of the electronic component 1B according to the third preferred embodiment.

The present invention is not limited to the above-described preferred embodiments, and various applications and modifications may be made within the scope of the present invention.

For example, a configuration in which five or more outer electrodes are provided on each of the first main surface 10*a* and the second main surface 10*b* may be provided. Also in this case, the outer electrodes may be provided on each of the first main surface 10*a* and the second main surface 10*b* such that the outer electrodes having different polarities are alternately arranged. In addition, each of the five or more outer electrodes provided on the second main surface 10*b* may be arranged such that at least a portion thereof faces a corresponding one of the five or more outer electrodes provided on the first main surface 10*a*.

However, it is preferable that an odd number of outer electrodes be provided on each of the first main surface 10*a* and the second main surface 10*b* for the following reasons.

In the case in which an electronic component is built into a substrate and an odd number of outer electrodes are provided on each of the first main surface 10*a* and the second main surface 10*b*, even if the electronic component is built into the substrate while being rotated 180 degrees in the horizontal direction such that the positions of the first end surface 10*e* and the second end surface 10*f* of the electronic component are exchanged, each substrate conductor is able to be connected to one of the outer electrodes, the one outer electrode having a polarity the same as that of the outer electrode to which the substrate conductor is to be connected when the electronic component is built into the substrate without rotating the electronic component 180 degrees in the horizontal direction.

Figure 19:
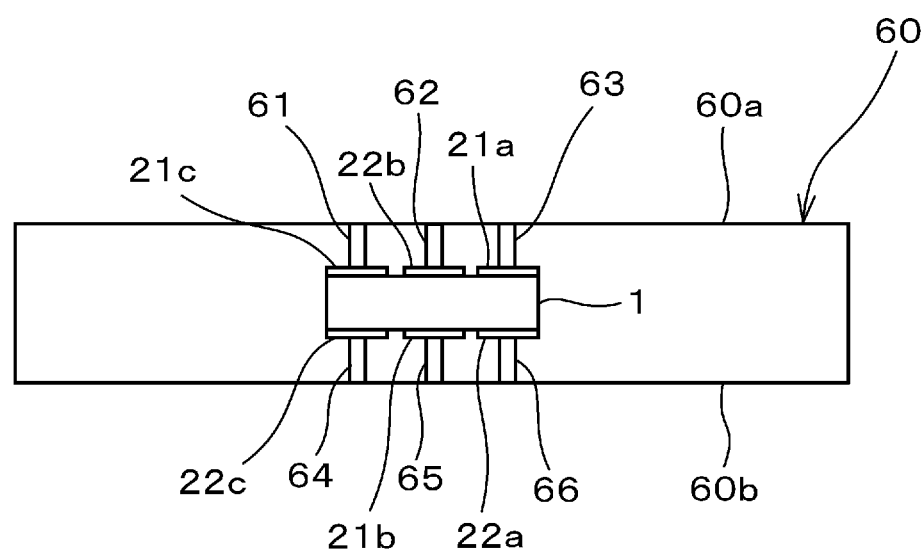
FIG. 19 is a cross-sectional view of a substrate that includes the electronic component according to the first preferred embodiment of the present invention built therein, the electronic component being rotated 180 degrees in the horizontal direction from the state illustrated in FIG. 6.

For example, FIG. 19 illustrates a cross-sectional view in a case in which the electronic component 1 is built into the substrate 60 in a state in which the electronic component 1 is rotated 180 degrees from the state illustrated in FIG. 6. In this case, as illustrated in FIG. 19, the first substrate conductor 61 is connected to the third outer electrode 21*c*, and the third substrate conductor 63 is connected to the first outer electrode 21*a*. In addition, the fourth substrate conductor 64 is connected to the sixth outer electrode 22*c*, and the sixth substrate conductor 66 is connected to the fourth outer electrode 22*a*.

As described in the first preferred embodiment, the first outer electrode 21*a* and the third outer electrode 21*c* have the same polarity, and the fourth outer electrode 22*a* and the sixth outer electrode 22*c* have the same polarity. Thus, as illustrated in FIG. 19, even when the electronic component 1 is built into the substrate 60 while being rotated 180 degrees, each substrate conductor is able to be connected to one of the outer electrodes, the one outer electrode having a polarity the same as that of the outer electrode to which the substrate conductor is connected in the case (see FIG. 6) in which the electronic component 1 is built into the substrate 60 without rotating the electronic component 180 degrees. In other words, the electronic component 1 is able to be built into the substrate 60 without checking the orientation of the electronic component 1 in the horizontal direction, so that the convenience of the electronic component 1 is improved.

In contrast, in the case in which an even number of outer electrodes are provided on each of the first main surface 10*a* and the second main surface 10*b*, when the electronic component is rotated 180 degrees in the horizontal direction, each of the substrate conductors is connected to one of the outer electrodes, the one outer electrode having a polarity different from that of a desired outer electrode.

Figure 20:
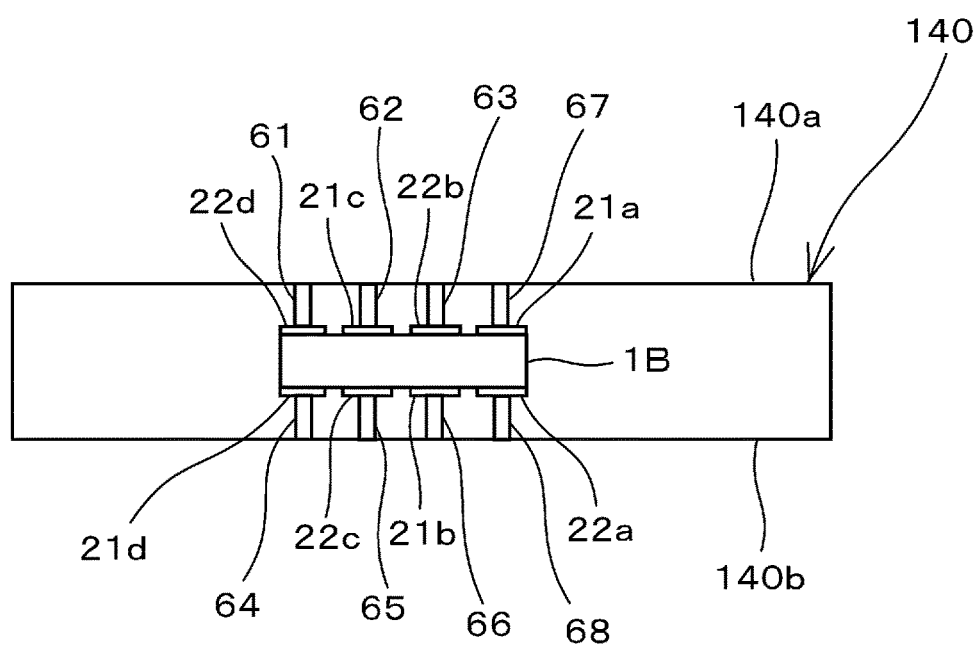
FIG. 20 is a cross-sectional view of a substrate that includes the electronic component according to the third preferred embodiment of the present invention built therein, the electronic component being rotated 180 degrees in the horizontal direction from the state illustrated in FIG. 14.

For example, FIG. 20 illustrates a cross-sectional view in a case in which the electronic component 1B is built into the substrate 140 in a state in which the electronic component 1B is rotated 180 degrees from the state illustrated in FIG. 14. In this case, as illustrated in FIG. 20, the first substrate conductor is connected to the seventh outer electrode 22d having a polarity different from that of the first outer electrode 21a, and the second substrate conductor 62 is connected to the third outer electrode 21c having a polarity different from that of the second outer electrode 22b. Similarly, each of the third substrate conductor 63, the fourth substrate conductor 64, the fifth substrate conductor 65, the sixth substrate conductor 66, the seventh substrate conductor 67, and the eighth substrate conductor is connected to one of the outer electrodes, the one outer electrode having a polarity different from that of the outer electrode to which the substrate conductor is connected in the configuration illustrated in FIG. 14.

Thus, in the case in which an even number of outer electrodes are provided on each of the first main surface 10a and the second main surface 10b, it is necessary to check the orientation of the electronic component in the horizontal direction and then build the electronic component into a substrate. However, also in the case in which an even number of outer electrodes are provided on each of the first main surface 10a and the second main surface 10b, an advantageous effect of reducing ESL is obtained by building the electronic component into the substrate after checking the orientation of the electronic component in the horizontal direction.

In the electronic component 1 according to the first preferred embodiment, which has been described above, although three of the outer electrodes are arranged in the longitudinal direction on each of the first main surface 10a and the second main surface 10b of the multilayer body 10, a configuration may be provided in which each three of the outer electrodes are arranged in the lateral direction, which is perpendicular or substantially perpendicular to the longitudinal direction. Similarly, also in the second, third, and fourth preferred embodiments, a configuration may be provided in which three or more outer electrodes are arranged in the lateral direction on each of the first main surface 10a and the second main surface 10b of the multilayer body 10.

Although a case has been described as an example in which an electronic component according to a preferred embodiment of the present invention is used by being built into a substrate, the electronic component may be disposed on a surface of a substrate. In addition, an electronic component according to a preferred embodiment of the present invention may be used by being disposed in or on a member other than a substrate.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
a multilayer body that includes a plurality of dielectric layers and a plurality of inner electrodes alternately laminated together;
a first outer electrode, a second outer electrode, and a third outer electrode that are arranged in this order in one direction on a first main surface of the multilayer body, the first main surface being located on an outer side of the multilayer body in a lamination direction;
a fourth outer electrode that is provided on a second main surface opposite to the first main surface in the lamination direction such that at least a portion of the fourth outer electrode faces the first outer electrode in the lamination direction;
a fifth outer electrode that is provided on the second main surface such that at least a portion of the fifth outer electrode faces the second outer electrode in the lamination direction; and
a sixth outer electrode that is provided on the second main surface such that at least a portion of the sixth outer electrode faces the third outer electrode in the lamination direction; wherein
the first outer electrode, the third outer electrode, and the fifth outer electrode are electrically connected to one another; and
the second outer electrode, the fourth outer electrode, and the sixth outer electrode are electrically connected to one another and each have a polarity that is different from a polarity of each of the first outer electrode, the third outer electrode, and the fifth outer electrode.

2. The electronic component according to claim 1, wherein
the first outer electrode, the third outer electrode, and the fifth outer electrode are electrically connected to one another on surfaces of the multilayer body via a first side-surface electrode that is provided on a first side surface of the multilayer body; and
the second outer electrode, the fourth outer electrode, and the sixth outer electrode are electrically connected to one another on the surfaces of the multilayer body via a second side-surface electrode that is provided on a second side surface opposite to the first side surface.

3. The electronic component according to claim 1, further comprising:
a first via conductor that connects the first outer electrode and first inner electrodes included in the plurality of inner electrodes, the first inner electrodes having a same polarity;
a second via conductor that connects the second outer electrode and second inner electrodes included in the plurality of inner electrodes, the second inner electrodes having a polarity different from the polarity of the first inner electrodes;
a third via conductor that connects the third outer electrode and the first inner electrodes;
a fourth via conductor that connects the fourth outer electrode and the second inner electrodes;
a fifth via conductor that connects the fifth outer electrode and the first inner electrodes; and
a sixth via conductor that connects the sixth outer electrode and the second inner electrodes; wherein
the first outer electrode, the third outer electrode, and the fifth outer electrode are connected to one another via the first via conductor, the third via conductor, the fifth via conductor, and the first inner electrodes; and
the second outer electrode, the fourth outer electrode, and the sixth outer electrode are electrically connected to one another via the second via conductor, the fourth via conductor, the sixth via conductor, and the second inner electrodes.

4. The electronic component according to claim 1, wherein
four or more outer electrodes including at least the first outer electrode, the second outer electrode, and the third outer electrode are provided on the first main surface such that the outer electrodes having different polarities are alternately arranged in the one direction;

four or more outer electrodes including at least the fourth outer electrode, the fifth outer electrode, and the sixth outer electrode are provided on the second main surface such that the outer electrodes having different polarities are alternately arranged in the one direction; and a number of the outer electrodes provided on the second main surface is equal to a number of the outer electrodes provided on the first main surface; and at least a portion of each of the four or more outer electrodes provided on the second main surface are arranged to face a corresponding one of the four or more outer electrodes provided on the first main surface.

5. The electronic component according to claim 1, wherein the number of the outer electrodes provided on the first main surface and the number of the outer electrodes provided on the second main surface are each an odd number.

6. The electronic component according to claim 1, wherein the one direction is parallel or substantially parallel to a long-side direction of each of the first main surface and the second main surface.

7. The electronic component according to claim 1, wherein the electronic component is a multilayer ceramic capacitor.

8. The electronic component according to claim 1, wherein the plurality of dielectric layers are ceramic layers.

9. The electronic component according to claim 8, wherein the ceramic layers are made of a material that includes, as a main component, $BaTiO_3$, $CaTiO_3$, $SrTiO_3$, $(Ba_{1-x}Ca_x)_zTiO_3$, or $CaZrO_3$.

10. The electronic component according to claim 9, wherein the ceramic layers include at least one of a Mg compound, a Mn compound, a Si compound, an Al compound, a V compound, or a Ni compound as a subcomponent having a content lower than that of the main component.

11. The electronic component according to claim 8, wherein the ceramic layers include outer-layer ceramic layers, each of which is an outer portion of the multilayer body in the lamination direction of the multilayer body, and the dielectric ceramic layers, each of which is located between one of the first inner electrodes and a corresponding one of the second inner electrodes.

12. The electronic component according to claim 1, wherein the first inner electrodes and the second inner electrodes are made of at least one of Cu, Ni, Ag, Pd, or Au, or an alloy including at least one Cu, Ni, Ag, Pd, or Au.

13. The electronic component according to claim 1, wherein each of the first outer electrode, the second outer electrode, the third outer electrode, the fourth outer electrode, the fifth outer electrode, and the sixth outer electrode has a rectangular or substantially rectangular shape.

14. The electronic component according to claim 1, wherein each of the first outer electrode, the second outer electrode, the third outer electrode, the fourth outer electrode, the fifth outer electrode, and the sixth outer electrode is a sputtered electrode.

15. The electronic component according to claim 14, wherein the sputtered electrodes are made of at least one of NiCr, NiCu, Ti or Cu.

16. A substrate comprising:
the electronic component according to claim 1.

17. The substrate according to claim 16, wherein the electronic component is built into the substrate.

18. The substrate according to claim 16, wherein each of the outer electrodes, which are provided on the first main surface and the second main surface, is connected to a substrate conductor which extends in a direction perpendicular or substantially perpendicular to the first main surface and the second main surface, and through which a current flows when the substrate conductor is energized.

* * * * *